(12) United States Patent
Tsai et al.

(10) Patent No.: US 11,366,159 B2
(45) Date of Patent: Jun. 21, 2022

(54) CHIP TRAY KIT AND CHIP TESTING APPARATUS

(71) Applicant: ONE TEST SYSTEMS, Santa Clara, CA (US)

(72) Inventors: Chen-Lung Tsai, Saratoga, CA (US); Gene Rosenthal, Santa Cruz, CA (US)

(73) Assignee: ONE TEST SYSTEMS

( * ) Notice: Subject to any disclaimer, the term of this patent is extended or adjusted under 35 U.S.C. 154(b) by 0 days.

(21) Appl. No.: 17/195,557

(22) Filed: Mar. 8, 2021

(65) Prior Publication Data
US 2022/0128626 A1      Apr. 28, 2022

(30) Foreign Application Priority Data

Oct. 23, 2020  (TW) .................................. 109136820

(51) Int. Cl.
*G01R 31/28*       (2006.01)

(52) U.S. Cl.
CPC ..... *G01R 31/2893* (2013.01); *G01R 31/2889* (2013.01)

(58) Field of Classification Search
CPC .. G01R 31/311; G01R 31/2834; G01R 31/28; G01R 31/2856; G01R 31/2874; G01R 31/2875; G01R 31/287; G01N 17/00; G01N 17/002; G11C 29/06; G11C 29/44; G11C 7/04

USPC ............ 324/750.26, 750.16, 750.19, 757.01, 324/762.01, 762.02, 762, 754.23
See application file for complete search history.

(56) References Cited

U.S. PATENT DOCUMENTS

| | | | | |
|---|---|---|---|---|
| 2006/0208721 | A1* | 9/2006 | Soeta | G01R 31/2865 324/750.05 |
| 2021/0018559 | A1* | 1/2021 | Tsai | G01R 31/2874 |

FOREIGN PATENT DOCUMENTS

| | | | |
|---|---|---|---|
| TW | I700499 B | 8/2020 | |
| WO | WO-2004095038 A1 * | 11/2004 | G01R 31/2893 |

* cited by examiner

*Primary Examiner* — Jermele M Hollington
*Assistant Examiner* — Courtney G McDonnough
(74) *Attorney, Agent, or Firm* — Li & Cai Intellectual Property Office

(57) ABSTRACT

A chip tray kit and a chip testing apparatus are provided. The chip testing apparatus includes the chip tray kit. The chip tray kit includes a tray, a plurality of chip fixing members, and a plurality of auxiliary insertion members. The tray includes a plurality of tray thru-holes, the chip fixing members are detachably fixed to the tray, and the chip fixing members are correspondingly arranged in the tray thru-holes. Each of the auxiliary insertion members is detachably fixed to a side of the chip fixing member, a portion of each of the auxiliary insertion members is arranged in a fixing thru-hole of the chip fixing member, and each of the auxiliary insertion members can limit a movement range of a chip in a chip accommodating slot of the chip fixing member.

20 Claims, 19 Drawing Sheets

CHIP TRAY KIT AND CHIP TESTING APPARATUS

CROSS-REFERENCE TO RELATED PATENT APPLICATION

This application claims the benefit of priority to Taiwan Patent Application No. 109136820, filed on Oct. 23, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip tray kit and a chip testing apparatus, and more particularly to a chip tray kit and a chip testing apparatus applicable to perform high frequency tests to a plurality of chips.

BACKGROUND OF THE DISCLOSURE

In an IC chip mounting process of a conventional IC chip testing apparatus (particularly a testing apparatus for performing high frequency tests to a plurality of IC chips), part of the IC chips may not be properly and electrically connected to a plurality of related probes of the conventional IC chip testing apparatus for various reasons. Accordingly, the IC chips that are not properly mounted to the related probes of the conventional IC chip testing apparatus cannot be correctly tested.

In the conventional IC chip testing apparatus, after the IC chips are mounted onto the conventional IC chip testing apparatus, the IC chips are generally not checked to confirm whether they are properly mounted. Therefore, technical personnel will usually find that part of the IC chips are not properly mounted or tested only after the testing of all of the IC chips have been completed.

In addition, the IC chips carried by a conventional tray can easily detach from the conventional tray when the tray is being transferred by a related apparatus, thereby causing inconvenience to the technical personnel.

SUMMARY OF THE DISCLOSURE

In response to the above-referenced technical inadequacies, the present disclosure provides a chip tray kit and a chip testing apparatus to improve the issues associated with a conventional IC chip testing apparatus. That is, part of a plurality of IC chips may not be correctly mounted onto the conventional IC chip testing apparatus, so that the IC chips are not correctly tested.

In one aspect, the present disclosure provides a chip tray kit including a tray, a plurality of chip fixing members, and a plurality of auxiliary insertion members. The tray includes a plurality of tray thru-holes each penetrating through the tray. The chip fixing members are detachably fixed to the tray. Each of the chip fixing members is arranged in a corresponding one of the tray thru-holes, and each of the chip fixing members includes a plurality of fixing thru-holes, a plurality of accommodating recesses, and a plurality of chip accommodating slots. Each of the fixing thru-holes penetrates through the chip fixing member, and each of the accommodating recesses is in spatial communication with the corresponding one of the chip accommodating slots and the corresponding one of the fixing thru-holes. Each of the chip accommodating slots is configured to accommodate a chip, each of the chip fixing members has at least one limiting structure formed in each of the chip accommodating slots, and the at least one limiting structure is configured to limit a movement range of the chip in the chip accommodating slot relative to the chip fixing member. The auxiliary insertion members are detachably fixed to one side of the chip fixing members. Each of the auxiliary insertion members includes a main body, a plurality of protrusions, and a plurality of insertion thru-holes, the protrusions protrude from a side of the main body, and each of the insertion thru-holes penetrates through the main body and the corresponding one of the protrusions. An outer diameter of each of the protrusions is less than a diameter of each of the accommodating recesses, the outer diameter of each of the protrusions is greater than a diameter of each of the chip accommodating slots, and a diameter of each of the insertion thru-holes is less than the diameter of each of the accommodating slots. When each of the insertion fixing members is fixed to a side of the corresponding one of the chip fixing members, each of the protrusions is correspondingly arranged in the accommodating recess, and a gap is formed between each of the protrusions and the chip disposed in the chip accommodating slot. The chip tray kit is configured to be fixed to a testing machine, the chips carried by the chip tray kit are configured to be electrically connected to the testing machine, and the testing machine is configured to test the chips. Each of the insertion thru-holes is configured to be inserted into by a pressing member, and a portion of the pressing member penetrating through the insertion thru-hole is configured to press a surface of the corresponding one of the chips disposed in the chip accommodating slot so that each of the chips is configured to be stably connected to the testing machine.

In another aspect, the present disclosure provides a chip testing apparatus including a chip tray kit, a lid, a plurality of pressing assemblies, a testing machine, and a temperature adjusting device. The chip tray kit includes a tray, a plurality of chip fixing members, and a plurality of auxiliary insertion members. The tray includes a plurality of tray thru-holes each penetrating through the tray. The chip fixing members are detachably fixed to the tray. Each of the chip fixing members is arranged in the corresponding one of the tray thru-holes, and each of the chip fixing members includes a plurality of fixing thru-holes, a plurality of accommodating recesses, and a plurality of chip accommodating slots. Each of the fixing thru-holes penetrates through the chip fixing member, and each of the accommodating recesses is in spatial communication with the corresponding one of the chip accommodating slots and the corresponding one of the fixing thru-holes. Each of the chip accommodating slots is configured to accommodate a chip, each of the chip fixing members has at least one limiting structure formed in each of the chip accommodating slots, and the at least one limiting structure is configured to limit a movement range of the chip in the chip accommodating slot relative to the chip fixing member. The auxiliary insertion members are detachably fixed to one side of the chip fixing members. Each of the auxiliary insertion members includes a main body, a plurality of protrusions, and a plurality of insertion thru-holes, the protrusions protrude from a side of the main body, and each of the insertion thru-holes penetrates through the main body and the corresponding one of the protrusions. An outer diameter of each of the protrusions is less than a diameter of each of the accommodating recesses, the outer diameter of each of the protrusions is greater than a diameter of each of the chip accommodating slots, and a diameter of each of the insertion thru-holes is less than the diameter of each of the accommodating slots. When each of the insertion fixing members is fixed to a side of the corresponding one of the chip fixing members, each of the protrusions is correspondingly arranged in the accommodating recess, and a gap is formed between each of the protrusions and the chip disposed in the chip accommodating slot. The chip tray kit is configured to be fixed to the testing machine, the chips carried by the chip tray kit are configured to be electrically connected to the testing machine, and the testing machine is configured to test the chips. Each of the insertion thru-holes is configured to be inserted into by a pressing member, and a portion of the pressing member penetrating through the insertion thru-hole is configured to press a surface of the corresponding one of the chips disposed in the chip accommodating slot so that each of the chips is configured to be stably connected to the testing machine. The lid has an accommodating slot formed on one side thereof. The lid is configured to cover a side of the tray. The pressing assemblies are disposed on the lid. Each of the pressing assemblies is arranged in the accommodating slot of the lid, and the pressing assemblies are configured to press the chips carried by the chip fixing members of the chip tray kit. The testing machine is configured to be connected to the chip tray kit. The testing machine is configured to be electrically connected to the chips carried by the chip tray kit, and the testing machine is configured to test the chips disposed in the chip accommodating slots. The temperature adjusting device is connected to the pressing assemblies. The temperature adjusting device is configured to allow a temperature of each of the pressing assemblies to reach a predetermined temperature.

Therefore, the chip tray kit of the present disclosure and the chip tray kit included in the chip testing apparatus of the present disclosure are mainly used to carry the chips. Through the auxiliary insertion members, the chips arranged in the chip fixing members do not easily leave the chip fixing members when the chip tray kit is being transferred.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
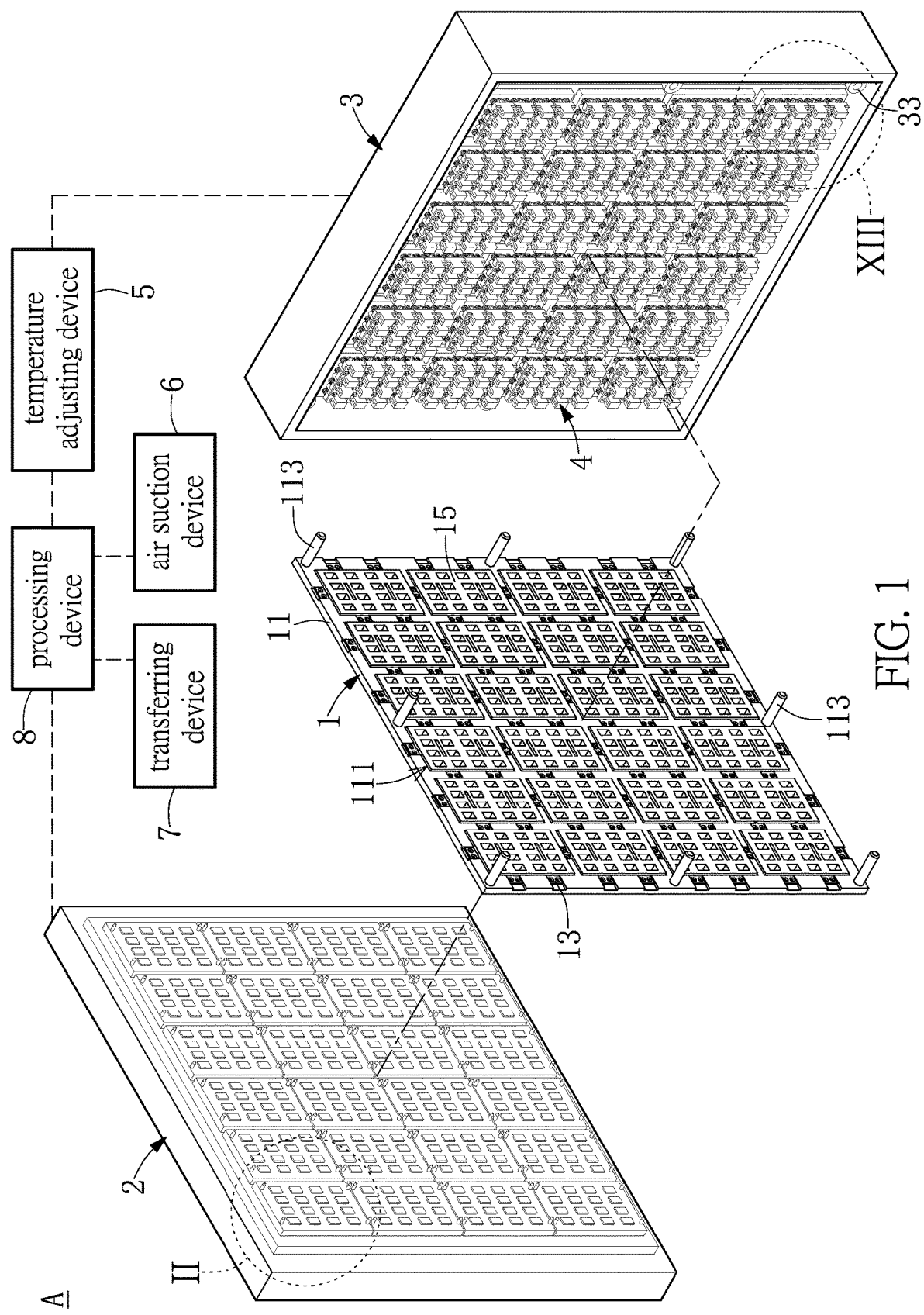
FIG. 1 is a schematic view of a chip testing apparatus of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

In the following description, if it is indicated that "reference is made to a specific figure" or "as shown in a specific figure", this is only to emphasize that in the description that follows, most content related thereto appears in said specific figure. However, the description that follows should not be construed as being limited to said specific figure only.

Figure 6:
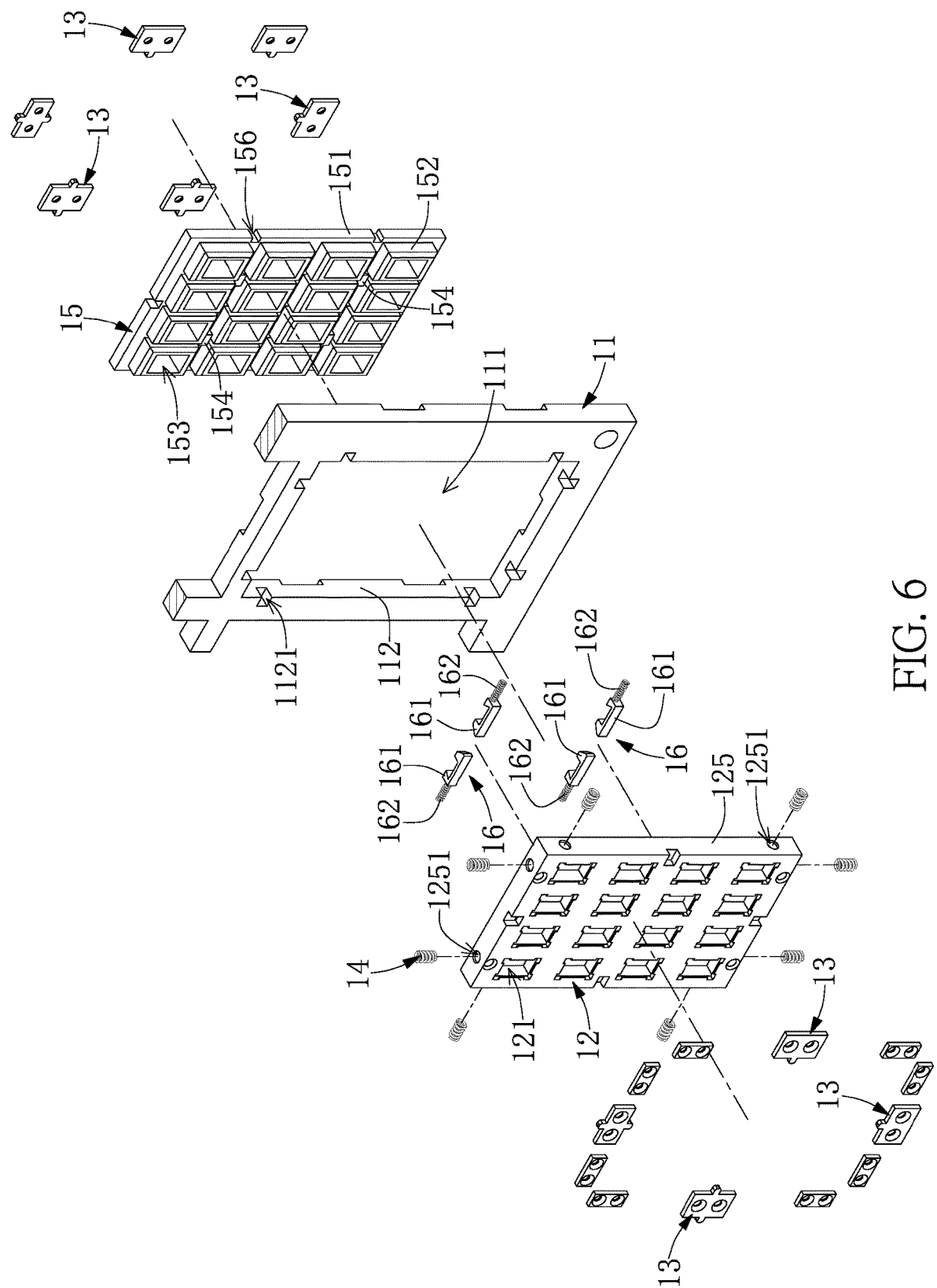
Figure 7:
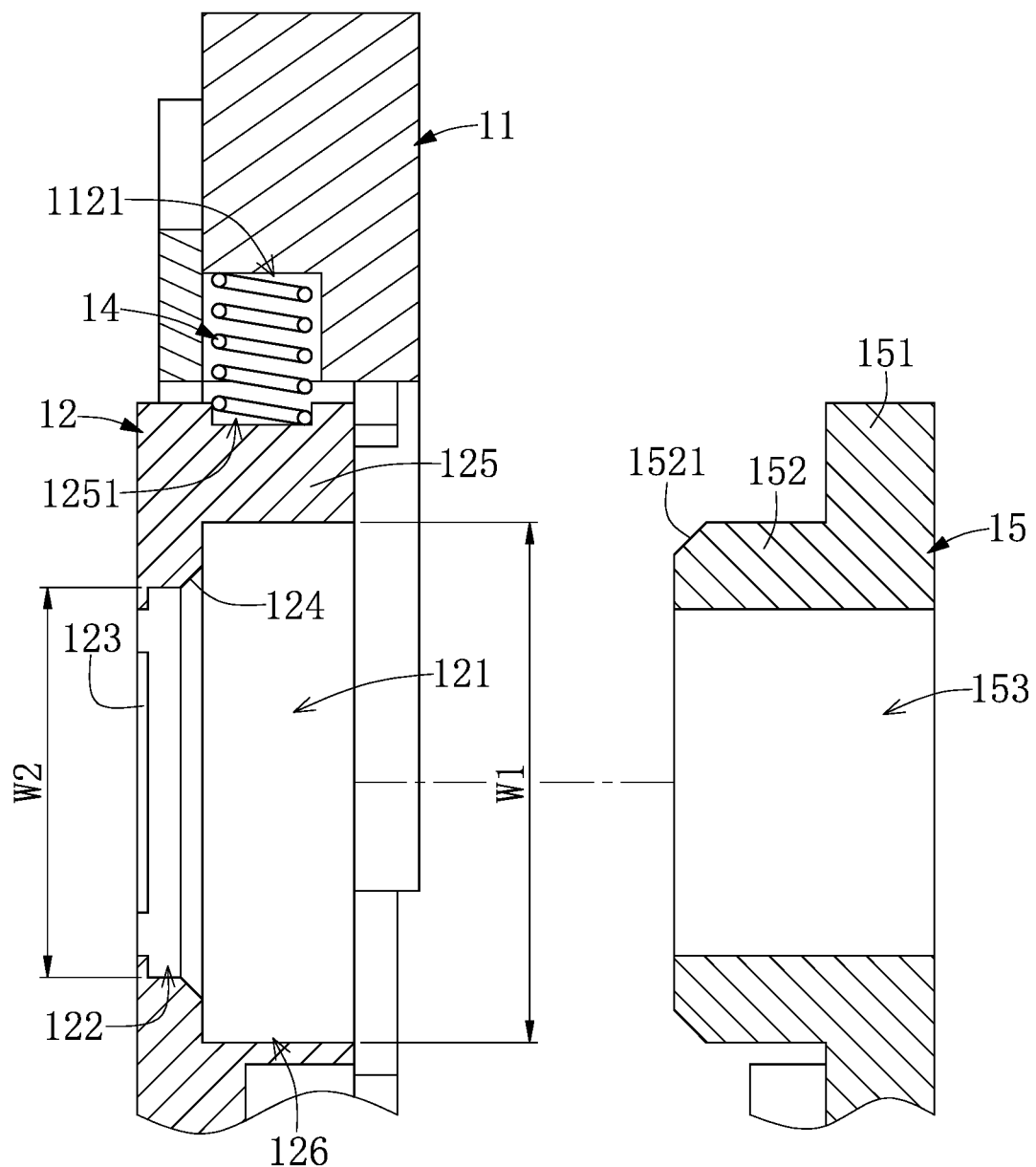
FIG. 7 is a partial sectional exploded view of the chip tray kit of the present disclosure.
Figure 8:
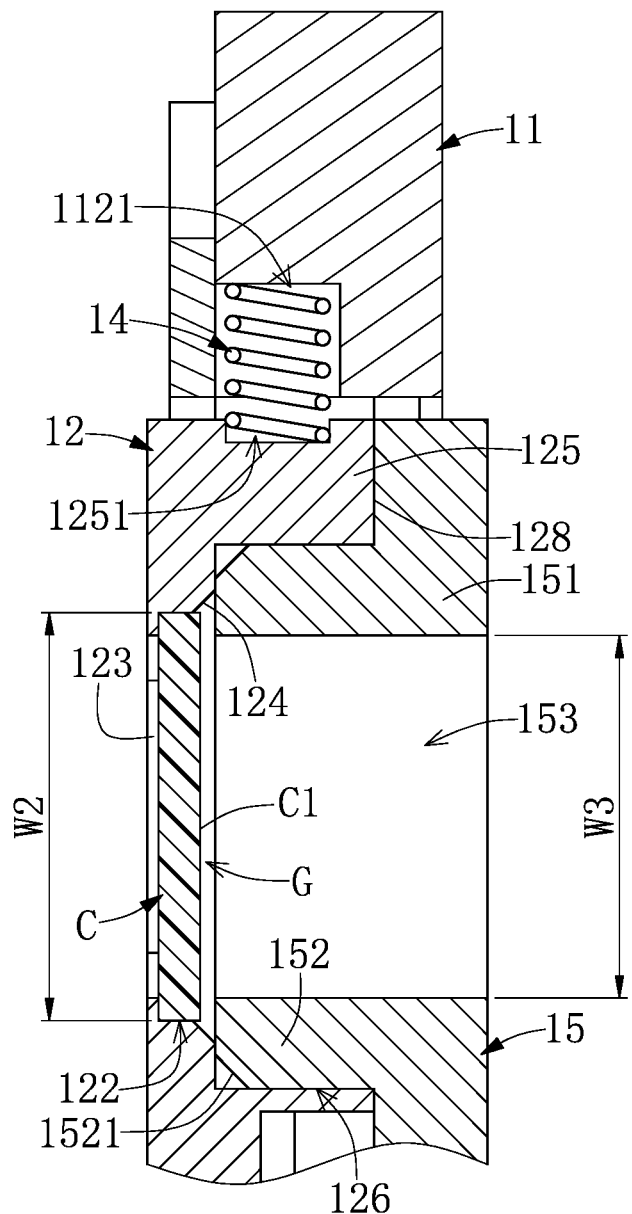
FIG. 8 is a partial sectional view of the chip tray kit having a chip disposed thereon according to the present disclosure.
Figure 9:
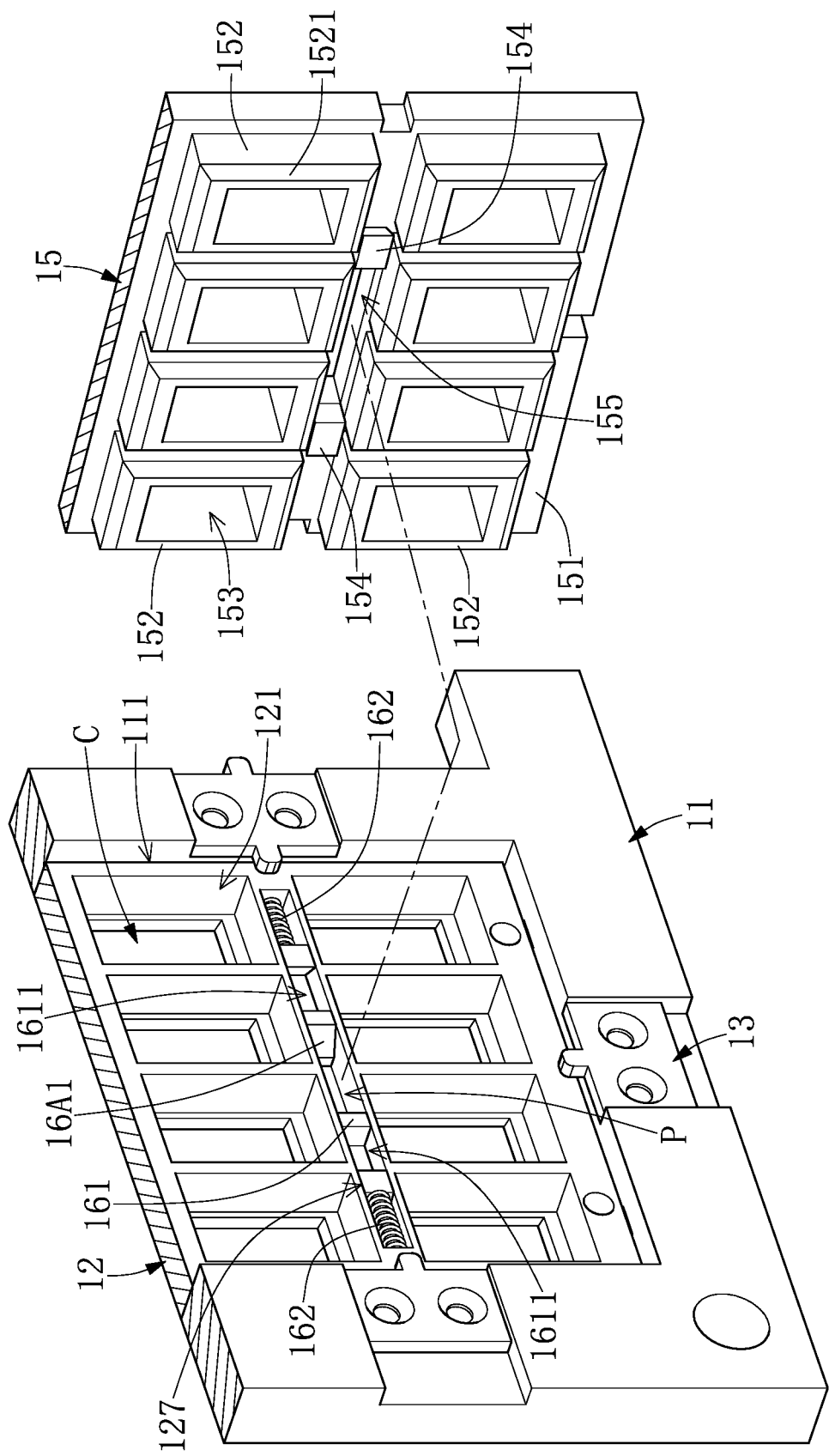
FIG. 9 is a partial sectional view of the chip tray kit of the present disclosure.

Referring to FIG. 1 to FIG. 8, a chip testing apparatus A of the present disclosure is configured to test a plurality of chips C (as shown in FIG. 8) carried by a chip tray kit 1. The chips C mentioned herein can be any IC chips or memories. The chip testing apparatus A includes a testing machine 2, a lid 3, a plurality of pressing assemblies 4, and a temperature adjusting device 5. The testing machine 2 and the lid 3 are configured to jointly hold the chip tray kit 1.

Figure 2:
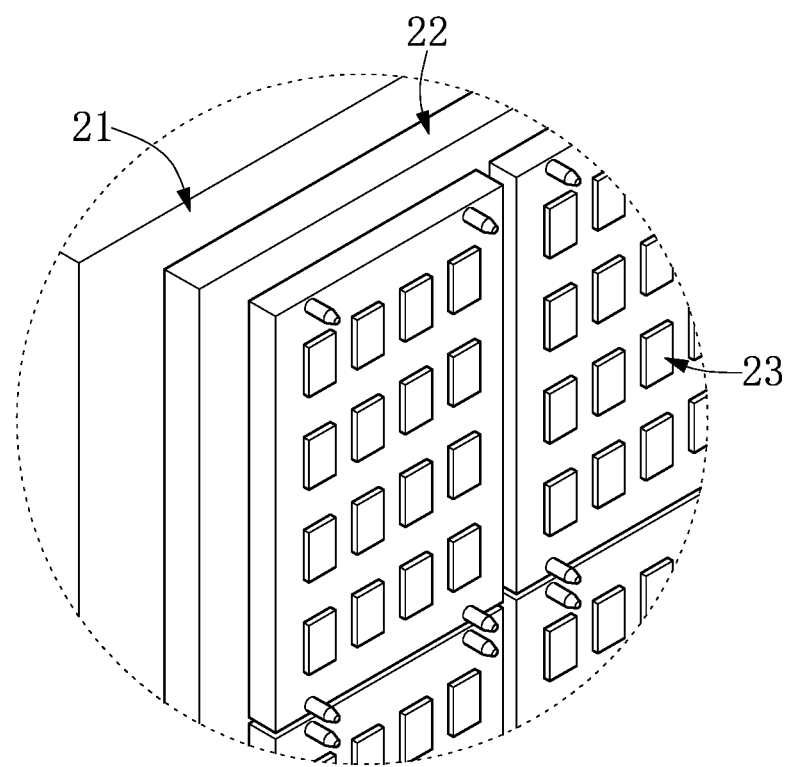
FIG. 2 is a partial enlarged view of FIG. 1.

Referring to FIG. 1 and FIG. 2, the testing machine 2 is configured to be connected to the chip tray kit 1, and the testing machine 2 is configured to be electrically connected to the chips C (as shown in FIG. 8) carried by the chip tray kit 1 to test the chips C. A testing content performed by the testing machine 2 to each of the chips C can be designed according to practical kinds and requirements of the chips C, and the present disclosure is not limited thereto. In a practical application, the testing machine 2 can include a machine body 21, a control set 22 disposed on the machine body 21, and a plurality of probe sockets 23. Each of the probe sockets 23 includes a plurality of probes (not shown), and the probes of the probe sockets 23 are configured to be electrically connected to the chips C under test, and the control set 22 is configured to perform a related testing process to test the chips C (as shown in FIG. 8) under test through the probe sockets 23. In a practical application, the machine body 21 can include a structure (not shown) to be fixed with the chip tray kit 1, the machine body 21 or each of the probe sockets 23 can include a structure (not shown) to auxiliarily limit the chips C, but the present disclosure is not limited thereto. The control set 22 can be a circuit board, a microprocessor or a control circuit.

Figure 3:
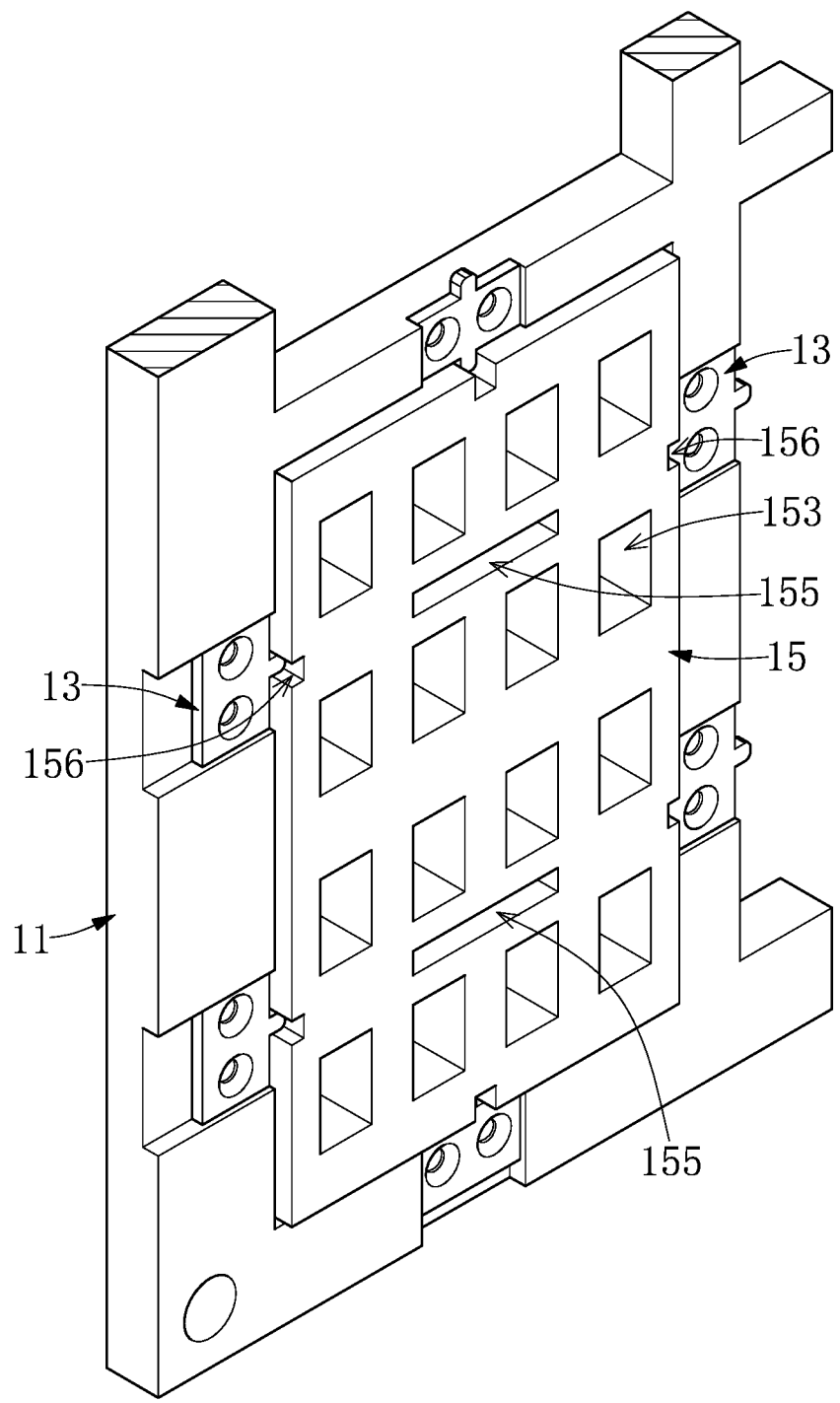
FIG. 3 and FIG. 4 are partial enlarged views of a chip tray kit of the present disclosure from different perspectives.

As shown in FIG. 1, FIG. 3, and FIG. 8, the chip tray kit 1 can include a tray 11 and twenty four chip fixing members 12. The tray 11 includes twenty four tray thru-holes 111, and each of the tray thru-holes 111 penetrates through the tray 11. The quantity, the structure, and the arrangement of the tray thru-holes 111 included by the tray 11 are not limited to those shown in FIG. 1, FIG. 3, and FIG. 8. The quantity of the chip fixing members 12 corresponds to the quantity of the tray thru-holes 111. Each of the chip fixing members 12 is detachably fixed to the tray 11, and the chip fixing members 12 are correspondingly fixed in the tray thru-holes 111.

Figure 4:
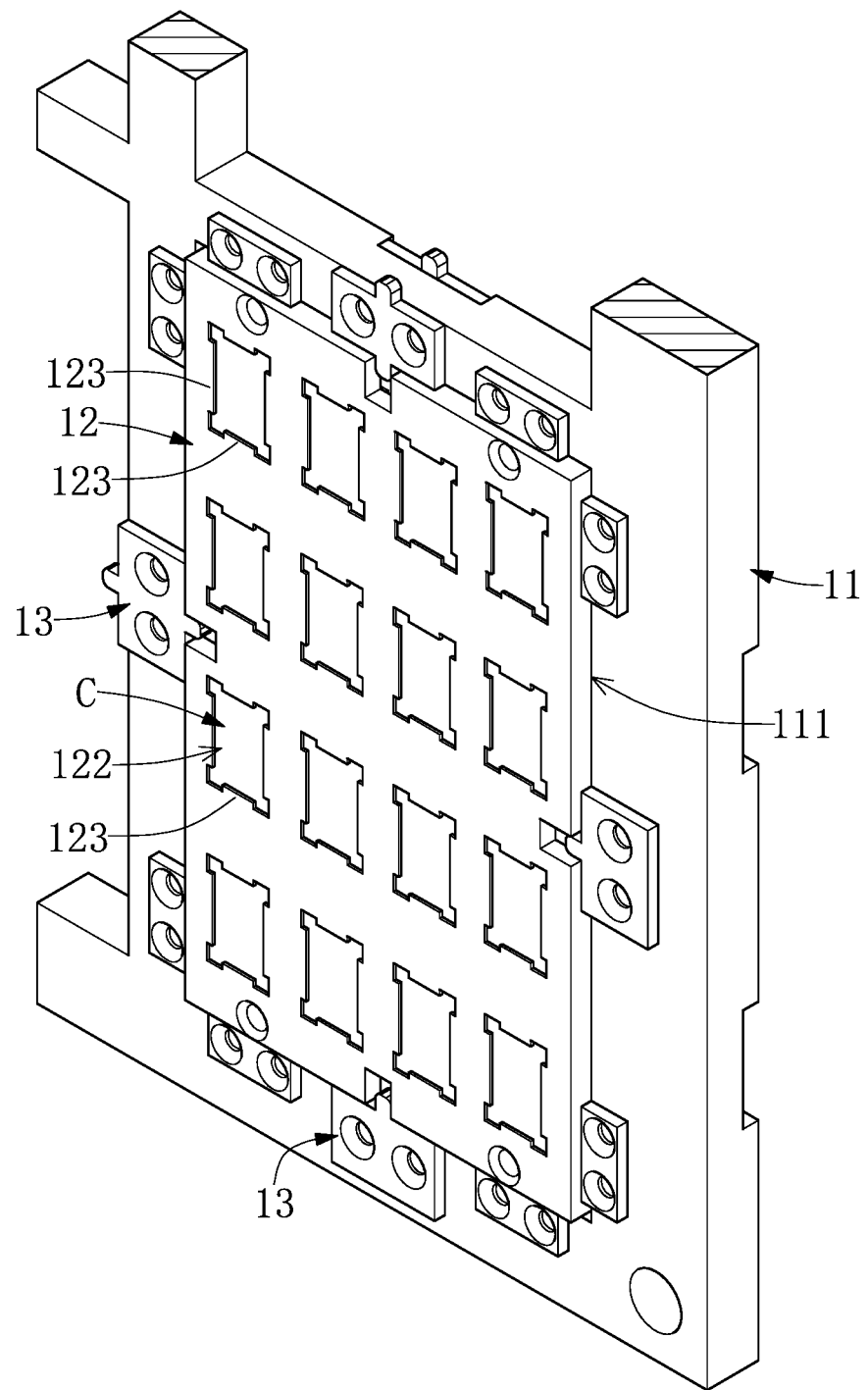

In a practical application, the chip tray kit 1 can further include a plurality of auxiliary fixing members 13, part of the auxiliary fixing members 13 are detachably fixed (e.g., in cooperation with a least one screw) to a side surface of the tray 11, and another part of the auxiliary fixing members 13 are detachably fixed to another side surface of the tray 11. In FIG. 3 and FIG. 4 of the present disclosure, each of the chip fixing members 12 can be fixed to the tray 11 through ten of the auxiliary fixing members 13, the two side surfaces of the tray 11 opposite to each other respectively have four auxiliary fixing members 13 and six auxiliary fixing members 13 disposed thereon, and the chip fixing member 12 can be fixed in the tray thru-hole 111 through the ten auxiliary fixing members 13. The structure and quantity of the auxiliary fixing members 13 used to fix one of the chip fixing members 12 to the tray 1 are not limited to those shown in FIG. 3 and FIG. 4.

Referring to FIG. 5 to FIG. 8, each of the chip fixing members 12 includes sixteen fixing thru-holes 121, sixteen chip accommodating slots 122, and a plurality of limiting structures 123. The quantity of the fixing thru-holes 121, the quantity of the chip accommodating slots 122, and the quantity of the limiting structures 123 of each of the chip fixing members 12 are not limited to those shown in FIG. 5 to FIG. 8. In each of the chip fixing members 12, each of the fixing thru-holes 121 penetrates through the chip fixing member 12, the chip accommodating slots 122 are in spatial communication with the fixing thru-holes 121, and each of the chip accommodating slots 122 is configured to carry one of the chips C under test. A plurality of electrical contacting portions (not shown, such as various types of pins) of the chips C disposed in the chip accommodating slots 122 are exposed from the chip fixing member 12, and the electrical contacting portions are configured to be connected to the probe sockets 23 so that the testing machine 2 (as shown in FIG. 1) can be electrically connected to the chips C.

Each of the limiting structures 123 is formed by a plurality of side walls forming the corresponding one of the chip accommodating slots 122 that extends toward the chip accommodating slot 122. The limiting structures 123 is the same chip accommodating slot 122 are configured to jointly limit a movement range of the chip C in the chip accommodating slot 122 to prevent the chip C in the chip accommodating slot 122 from leaving the chip accommodating slot 122. In the present embodiment, the chip C in the accommodating slot 122 is limited by four limiting structures 123, but the quantity, the position, and the structure of the limiting structures 123 are not limited to those shown in FIG. 5 to FIG. 8. Naturally, the limiting structures 123 do not prevent the chip C in the accommodating slot 122 from being electrically connected to the probe sockets 23 of the testing machine 2.

Referring to FIG. 7, in a practical application, each of the chip fixing members 12 can include a guide structure 124 therein, and the guide structure 124 can be an inclined surface that is inclined toward the chip accommodating slot 122. Through the design of the guide structure 124, in a process where the chip C is disposed into the chip accommodating slot 122 through the fixing thru-hole 121, even if a placement position of the chip C is slightly deviated, the chip C can be guided by the guide structure 124 to be successfully disposed into the chip accommodating slot 122.

According to the above, since the chip fixing members 12 are detachably fixed to the tray 11, a user can selectively change the chip accommodating slots 122 and the fixing thru-holes 121 having different structures and dimensions of the chip fixing members 12 according to the type, the structure, and the dimension of the chips C under test.

Figure 5:
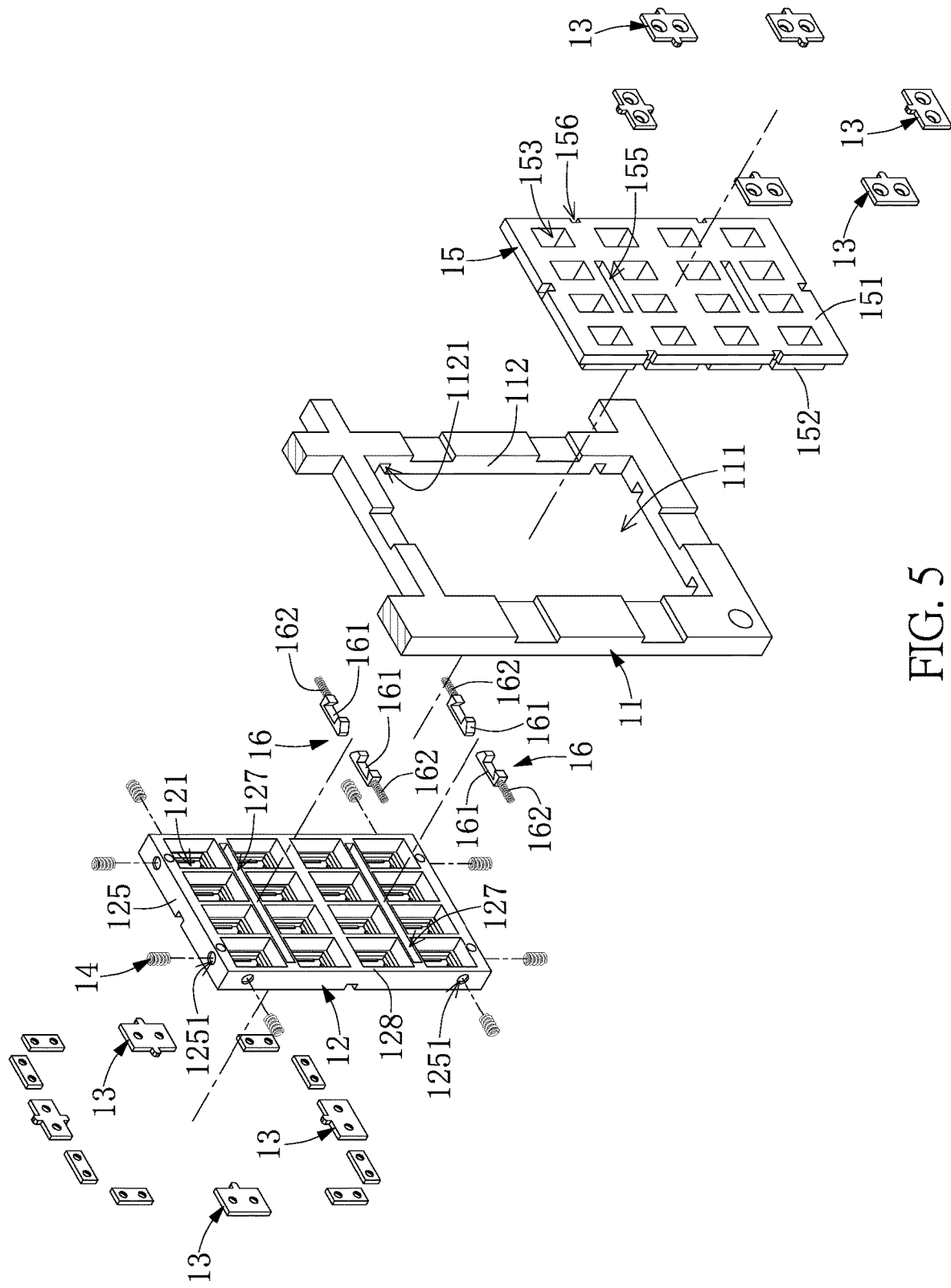
FIG. 5 and FIG. 6 are partial exploded views of the chip tray kit of the present disclosure from different perspectives.

Referring to FIG. 5 and FIG. 6, in a preferable application, the chip tray kit 1 can further include a plurality of elastic members 14. One end of each of the elastic members 14 is fixed to a first accommodating slot 1121 of a plurality of side walls 112 forming each of the tray thru-holes 111, and another end of each of the elastic members 14 is correspondingly disposed in a second accommodating slot 1251 of a plurality of side walls 125 of the chip fixing member 12. In an embodiment of the present disclosure, each of the chip fixing members 12 is substantially in a rectangular structure, at least one of the elastic members 14 can be disposed between each of the side walls 125 of the chip fixing member 12 and each of the side walls 112 forming the tray thru-hole 111.

When the chip fixing members 12 are fixed to the tray thru-holes 111, each of the elastic members 14 is in a pressed state, and an elastic force generated by each of the elastic members 14 being pressed pushes the chip fixing member 12. Therefore, the chip fixing members 12 can be stably disposed in the tray thru-holes 111. The elastic members 14 are disposed between the side walls 125 of the chip fixing members 12 and the side walls 112 forming the tray thru-holes 111, and the auxiliary fixing members 13 are fixed on two opposite wide surfaces of the tray 11. Therefore, when the auxiliary fixing members 13 are detached from the tray 11 by a user, the chip fixing members 12 can still remain disposed on the tray 11 due to the elastic members 14 pushing the chip fixing members 12, thereby preventing the chip fixing members 12 from falling off when the auxiliary fixing members 13 are detached from the tray 11. In addition, through the arrangement of the elastic members 14, when the chip tray kit 1 is fixed to one side of the testing machine 2 (as shown in FIG. 1), the chip fixing members 12 move slightly relative to the tray 11. Therefore, the chips C carried by the chip fixing members 12 can be easily connected to the probe sockets 23 (as shown in FIG. 2) of the testing machine 2.

Referring to FIG. 1 and FIG. 5 to FIG. 9, the chip tray kit 1 can further include twenty four auxiliary insertion members 15. The quantity of the auxiliary insertion members 15 is corresponding to the quantity of the chip fixing members 12, but the quantity of the auxiliary insertion members 15 is not limited to that shown in FIG. 1 and FIG. 5 to FIG. 9. Each of the auxiliary insertion members 15 is detachably disposed on one side of the corresponding one of the chip fixing members 12.

Each of the auxiliary insertion members 15 includes a main body 151 and a plurality of protrusions 152. Each of the protrusions 152 protrudes from one side of the main body 151, and the quantity of the protrusions 152 corresponds to the quantity of the fixing thru-holes 121 of each of the chip fixing members 12. Each of the chip fixing members 12 can further include a plurality of accommodating recesses 126, and each of the accommodating recesses 126 is in spatial communication with the corresponding one of the chip accommodating slots 122. A diameter W1 of the accommodating recess 126 is greater than a diameter W2 of the chip accommodating slot 122, and the accommodating recesses 126 are configured to accommodate the protrusions 152 of the auxiliary insertion members 15.

Figure 18:
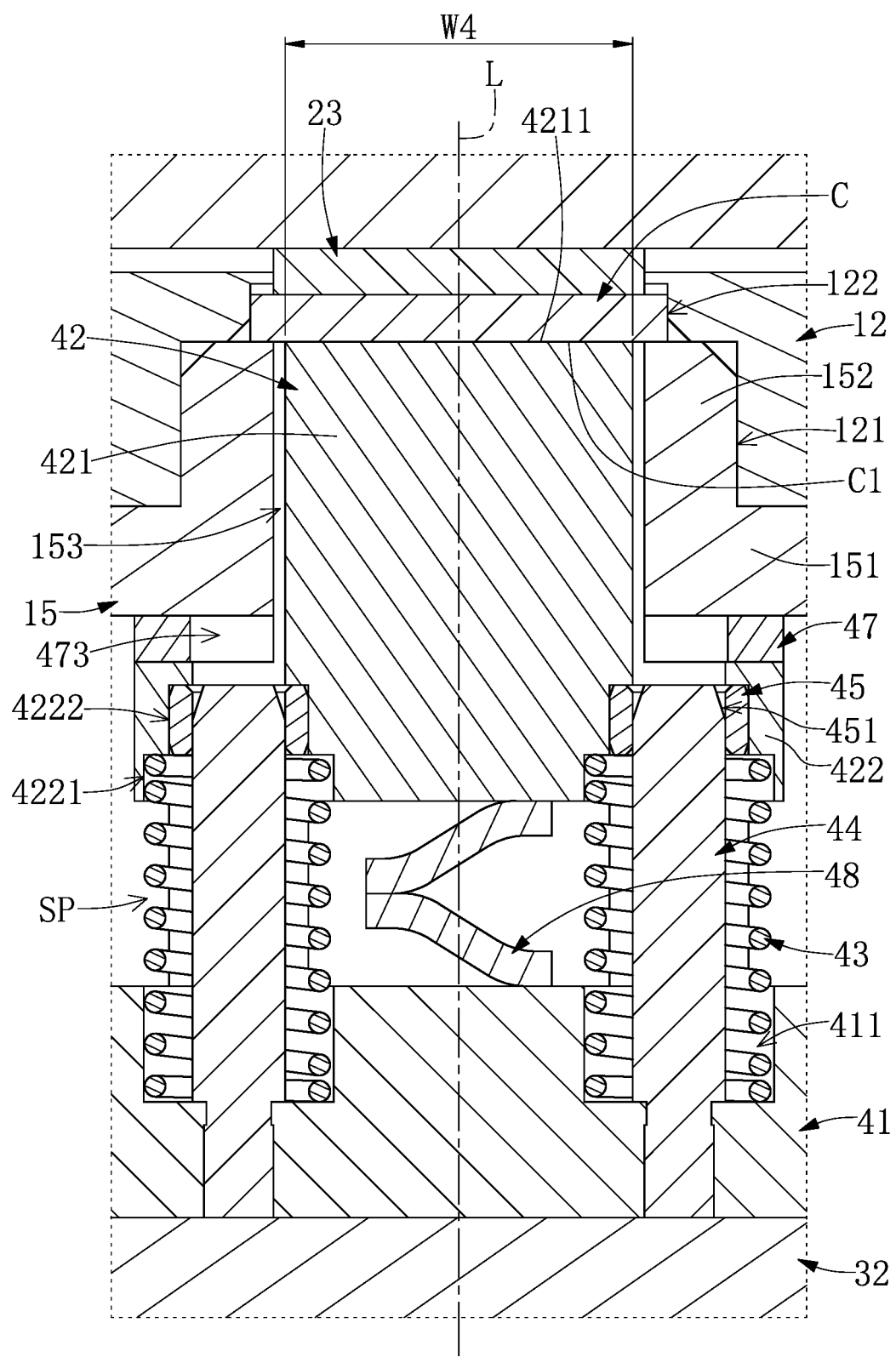
FIG. 18 is a partial enlarged view of FIG. 17.

Each of the auxiliary insertion members 15 includes an insertion thru-hole 153 penetrating through the main body 151 and the protrusions 152. A diameter W3 of the insertion thru-hole 153 is greater than an outer diameter W4 of a contacting portion 421 of the pressing member 42 (as shown in FIG. 18 and will be described as follows), and a portion of the contacting portion 421 is configured to penetrate through the insertion thru-hole 153 and is exposed from a side of the auxiliary insertion member 15 (as shown in FIG. 18). The diameter W3 of the insertion thru-hole 153 is less than the diameter W2 of the chip accommodating slot 122. A height of the protrusion 152 is substantially equal to a depth of the accommodating recess 126. When the protrusion 152 is arranged in the accommodating recess 126, the main body 151 of the auxiliary insertion member 15 correspondingly abuts against a top surface 128 (as shown in FIG. 8) of the chip fixing member 12.

Referring to FIG. 7 and FIG. 8, each of the protrusions 152 can include a plurality of guide inclined surfaces 1521 to allow the protrusion 152 to swiftly and correctly enter the fixing thru-hole 121. The guide inclined surfaces 1521 are configured to enable the protrusion 152 to enter the fixing thru-hole 121 more easily. Referring to FIG. 8, in a practical application, when the chip C is disposed in the chip accommodating slot 122 and the protrusion 152 is arranged in the accommodating recess 126, a gap G is formed between the protrusion 152 and a surface C1 of the chip C, and the protrusion 152 is not in contact with the surface C1 of the chip C. When the chip fixing members 12 and the auxiliary insertion members 15 are fixed to the tray 11, the chips C disposed in the chip accommodating slots 122 of the chip fixing members 12 are jointly limited by the chip fixing members 12 and the auxiliary insertion members 15, such that it is difficult for the chips C to be detached from the chip fixing members 12.

The present disclosure does not limit the manner in which each of the auxiliary insertion members 15 is detachably disposed on one side of the corresponding one of the chip fixing members 12. Any manner that can allow each of the auxiliary insertion members 15 to be detachably disposed on one side of the corresponding one of the chip fixing members 12 falls within the scope of the present disclosure. For example, in one embodiment of the present disclosure, each of the auxiliary insertion members 15 and each of the chip fixing members 12 can be disposed in the tray thru-hole 111 of the tray 11 together, and the auxiliary fixing members 13 mentioned above can limit a movement range of each of the auxiliary insertion members 15 and each of the chip fixing members 12 relative to the tray 11. In other words, each of the auxiliary insertion members 15 and each of the chip fixing members 12 are fixed in the tray thru-hole 111 of the tray 11 through the auxiliary fixing members 13.

According to the above, as shown in FIG. 1, FIG. 5, FIG. 6, and FIG. 9 to FIG. 12, in a preferable embodiment, the chip tray kit 1 can further include a plurality of quick release assemblies 16. At least one of the quick release assemblies 16 is arranged between each of the auxiliary insertion members 15 and the corresponding one of the chip fixing members 12, and each of the auxiliary insertion members 15 can be quickly mounted to or detached from one side of the chip fixing member 12 through the at least one of the quick release assemblies 16. For example, in each of the chip fixing members 12, two of the quick release assemblies 16 can be disposed on the chip fixing member 12, and each of the quick release assemblies 16 can include two limiting members 161 and two elastic members 162. Each of the chip fixing members 12 can further include a recess 127, one end of each of the two elastic members 162 is fixed to a side wall forming the recess 127, another end of each of the two elastic members 162 is fixed to one of the limiting members 161, and the two limiting members 161 of each of the quick release assemblies 16 are disposed in one of the recesses 127.

Each of the limiting members 161 can be pushed to move in the corresponding one of the recesses 127 to correspondingly press the elastic member 162 connected thereto, and the pressed elastic member 162 correspondingly generates an elastic returning force. When the limiting member 161 is no longer pushed, the elastic returning force generated by the elastic member 162 being pressed allows the limiting member 161 to return to a position where the limiting member 161 is not pushed. When the two limiting members 161 are disposed in the recess 127, a gap P is formed between the two limiting members 161.

Each of the limiting members 161 can include an engaging slot 1611, each of the engaging slots 1611 separates the limiting member 161 into a pushing portion 16A and an engaging portion 16B, the pushing portion 16A has a guide inclined surface 16A1 at an end thereof opposite to the elastic member 162, and the engaging portion 16B has an engaging inclined surface 16B1 at an end thereof facing toward the pushing portion 16A.

Figure 10:
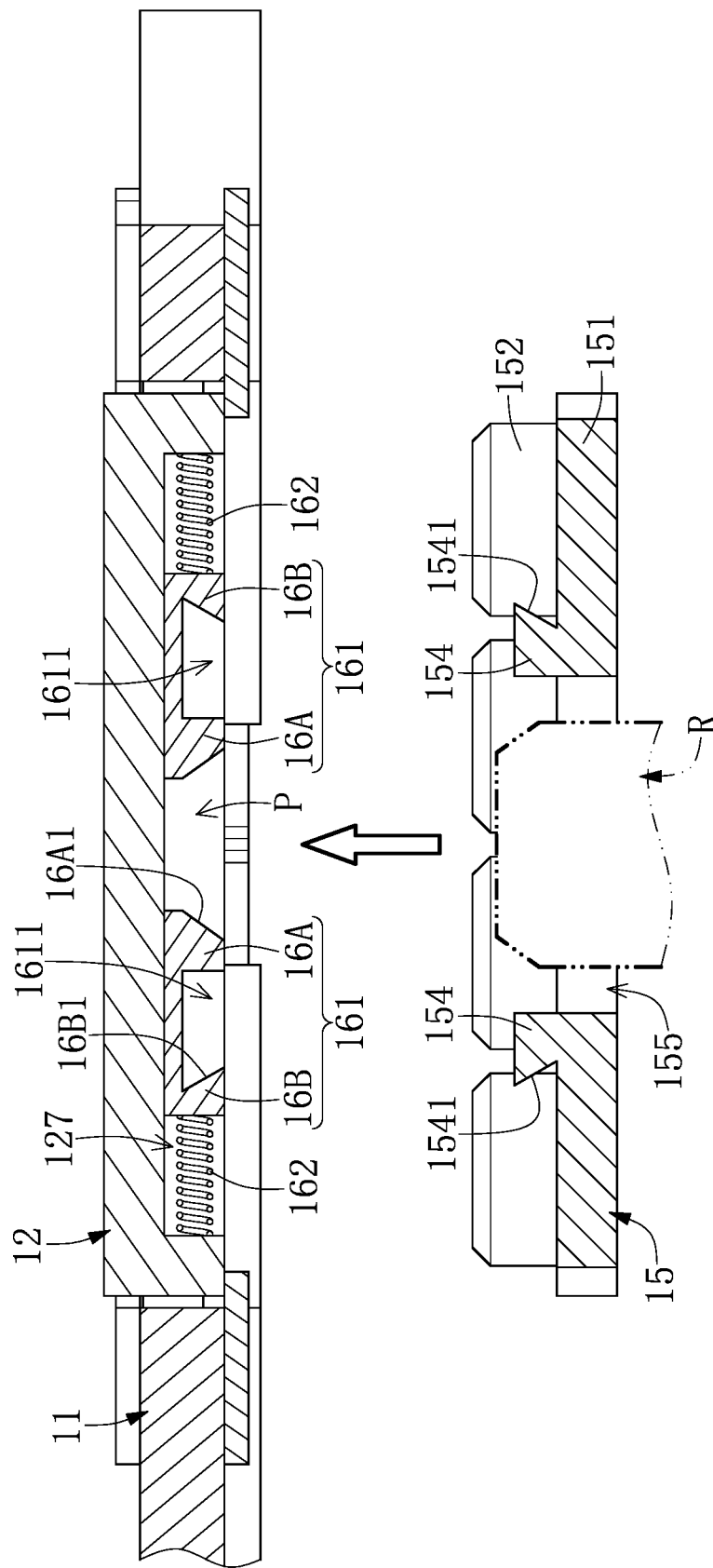
FIG. 10 to FIG. 12 are operational schematic views of an auxiliary insertion member of the chip tray kit being fixed with a chip fixing member according to the present disclosure.

Referring to FIG. 10, each of the auxiliary insertion members 15 can have a thru-hole 155 formed thereon and can have two engaging members 154 disposed thereon, the two engaging members 154 are arranged at two ends of the thru-hole 155, and each of the engaging members 154 has an engaging inclined surface 1541 at an end thereof opposite to the thru-hole 155. The thru-hole 155 of each of the auxiliary insertion members 15 is configured to provide an insertion member R to insert therein. The insertion member R is configured to push the two limiting members 161 disposed on the chip fixing member 12. In a practical application, the insertion member R can be fixed to a related robotic arm configured to fix the auxiliary insertion member 15 to the chip fixing member 12.

Figure 11:
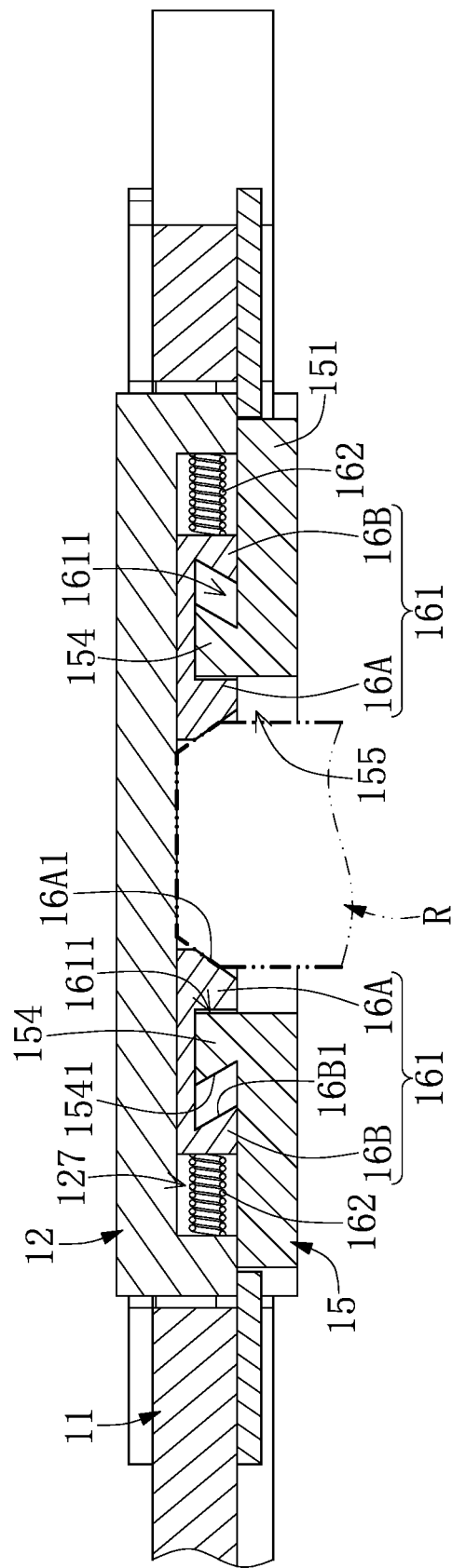

Referring to FIG. 10 and FIG. 11, a process where the auxiliary insertion member 15 is in cooperation with the insertion member R and is to be fixed to the chip fixing member 12 can be exemplified as follows. First, the insertion member R penetrates through the thru-hole 155 of the auxiliary insertion member 15 and enters into the gap P between two limiting members 161. Since an outer diameter W4 of the insertion member R is greater than a width of the gap P, when the insertion member R enters the recess 127, the insertion member R pushes the pushing portions 16A of the two limiting members 161, and each of the limiting members 161 moves accordingly toward the corresponding one of the elastic members 162, such that each of the elastic members 162 is pressed and elastically deformed.

Figure 12:
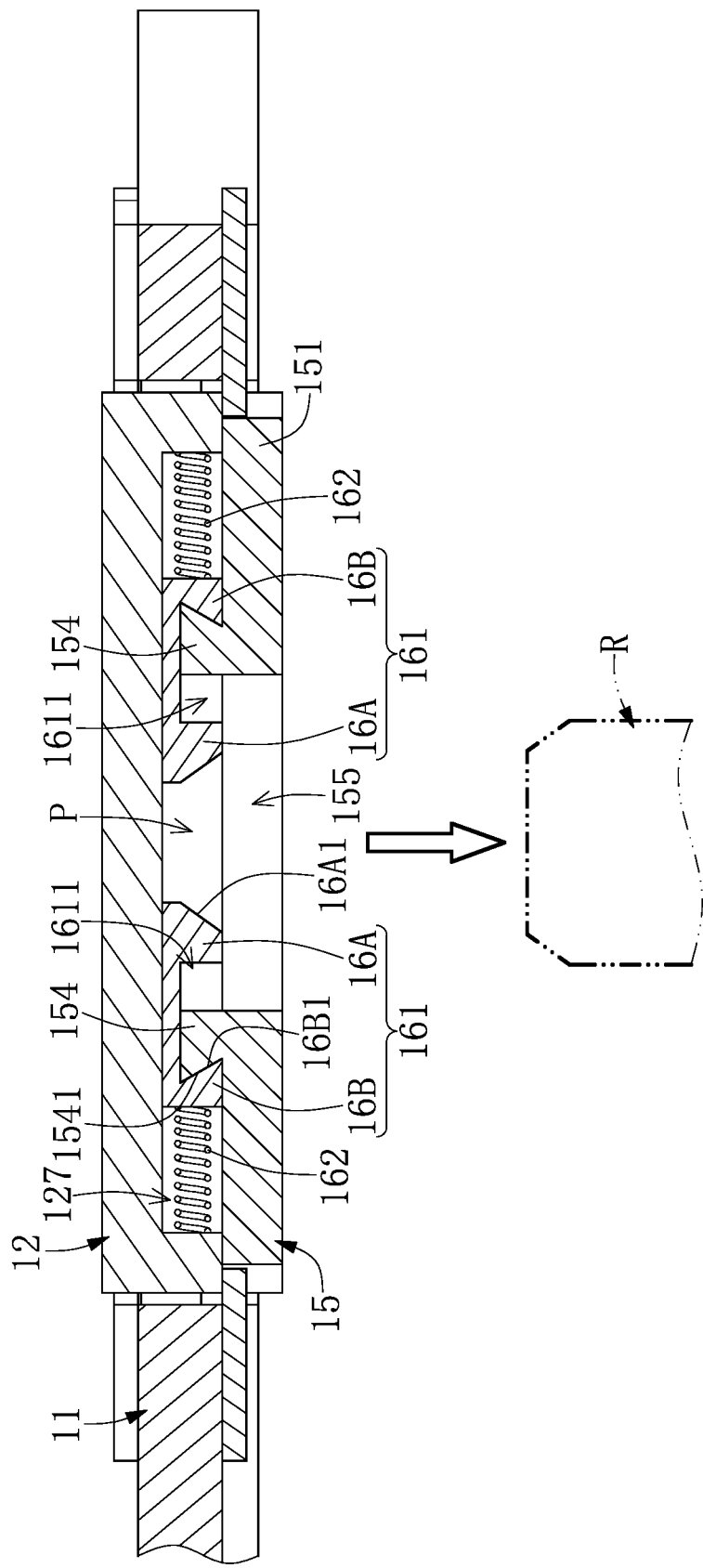

According to the above, as shown in FIG. 11, when an end of the insertion member R abuts against a bottom portion forming the recess 127, each of the engaging members 154 is disposed in the engaging slot 1611 of the corresponding one of the limiting members 161, the engaging inclined surface 1541 of each of the engaging members 154 faces toward the engaging inclined surface 16B1 of the engaging portion 16B of the adjacent limiting member 161, and each of the engaging inclined surfaces 1541 is not in contact with the adjacent engaging inclined surface 16B1. Afterwards, as shown in FIG. 12, when the insertion member R is removed from the recess 127, the elastic returning forces generated by the two elastic members 162 in the recess 127 being pressed allow the two limiting members 161 to move toward each other. Finally, the engaging inclined surface 16B1 of the engaging portion 16B of each of the limiting members 161 abuts against the engaging inclined surface 1541 of the adjacent engaging member 154, and the auxiliary insertion member 15 is accordingly engaged with and fixed to the chip fixing member 12.

Referring to FIG. 12, when the auxiliary insertion member 15 is fixed to the chip fixing member 12 through the engaging members 154 and the quick release members 16, a structure (e.g., a related robot arm) can allow the insertion member R to penetrate through the thru-hole 155 of the auxiliary insertion member 15 and enter into the gap P between the two limiting members 161 to push the two limiting members 161. At this time, the two limiting members 161 change from a state shown in FIG. 12 to a state shown in FIG. 11. In the state shown in FIG. 11, the engaging inclined surface 16B1 of each of the limiting members 161 is no longer in contact with the engaging inclined surface 1541 of the adjacent engaging member 154. The structure (e.g., the related robot arm) can hold the auxiliary insertion member 15 and pull out the auxiliary insertion member 15 in a direction away from the chip fixing member 12 so as to separate the auxiliary insertion member 15 and the chip fixing member 12.

Referring to FIG. 3 and FIG. 5, it is worth mentioning that in an embodiment of the present disclosure, each of the auxiliary insertion members 15 is fixed to the chip fixing member 12 through the quick release assemblies 16, and each of the auxiliary insertion members 15 can have a plurality of avoidance holes 156 formed thereon. Each of the avoidance holes 156 is configured to avoid the auxiliary fixing member 13 so that the auxiliary fixing members 13 do not limit the movement range of the auxiliary insertion member 15.

Figure 13:
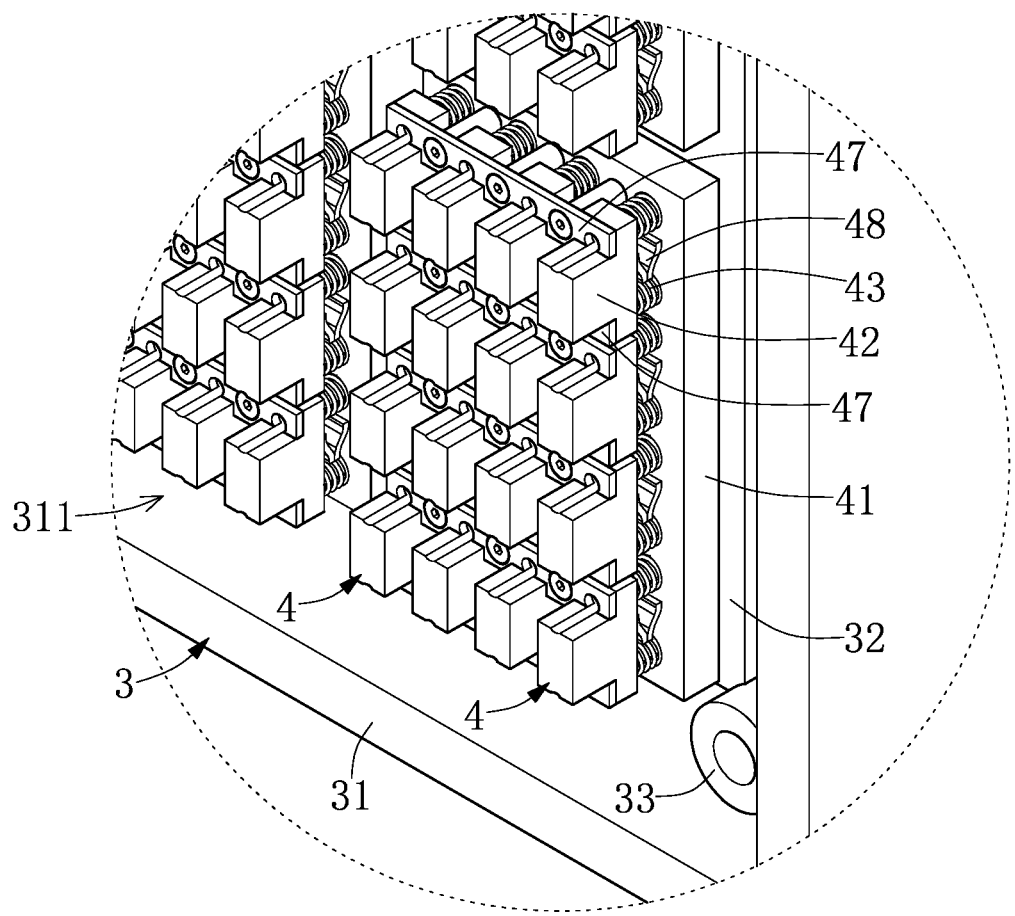
FIG. 13 is a partial enlarged view of FIG. 1.
Figure 16:
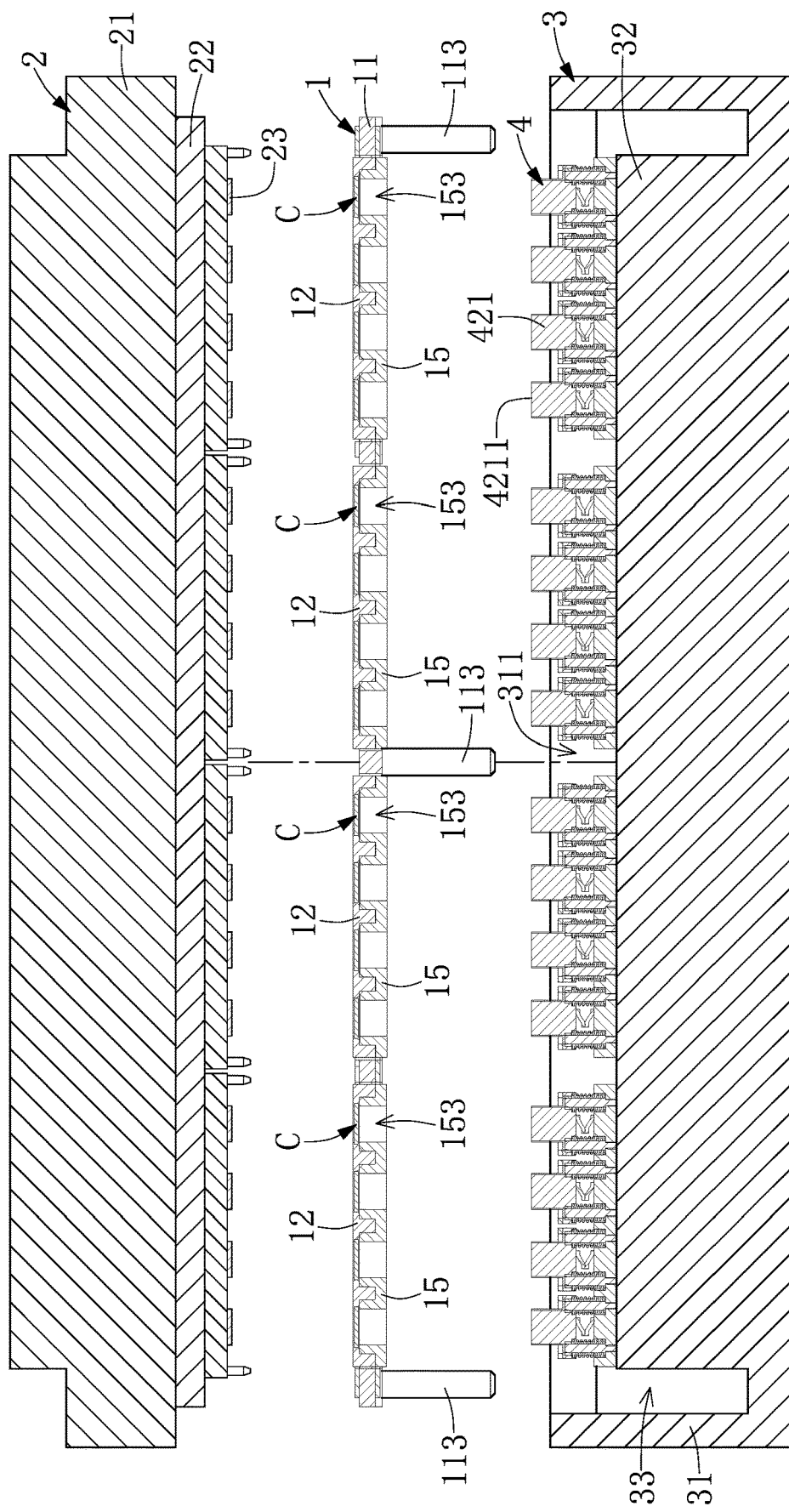
FIG. 16 is a sectional view showing a lid separated from the chip tray kit according to the present disclosure.

Referring to FIG. 1, FIG. 13 and FIG. 16, the lid 3 can include a main body 31 and a conduction structure 32, one side of the main body 31 is recessed to form an accommodating slot 311, the conduction structure 32 forms on one side of the main body 31, and the conduction structure 32 is arranged in the accommodating slot 311. A plurality of pressing assemblies 4 are disposed on the lid 3, and each of the pressing assemblies 4 is arranged in the accommodating slot 311 of the lid 3. It should be noted that in FIG. 16 of the present embodiment, the pressing assemblies 4 protrude from one end of the lid 3, but the present disclosure is not limited thereto. In other embodiments, the pressing assemblies 4 can be provided to not protrude from the lid 3, and the pressing assemblies 4 are completely arranged in the accommodating slot 311 of the lid 3. In other words, a sum of a thickness of the conduction structure 32 and a height of each of the pressing assemblies 4 can be greater than, equal to, or less than a depth of the accommodating slot 311 of the lid 3.

The lid 3 is configured to cover a side of the tray 11. When the lid 3 covers the side of the tray 11, the pressing assemblies 4 disposed on the lid 3 correspondingly press the surfaces C1 (as shown in FIG. 18) of the chips C in the chip fixing members 12 disposed on the tray 11. In other embodiments, when the lid 3 covers the side of the tray 11, the pressing assemblies 4 cannot be in contact with the chips C, until air in an enclosed space jointly defined by the lid 3 and the tray 11 is suctioned away, such that the pressing assemblies 4 press the surfaces C1 of the chips C. The dimension and the structure of the lid 3 and the quantity of the pressing assemblies 4 disposed on the conduction structure 32 of the lid 3 are not limited to those shown in FIG. 1, FIG. 13 and FIG. 16.

Figure 17:
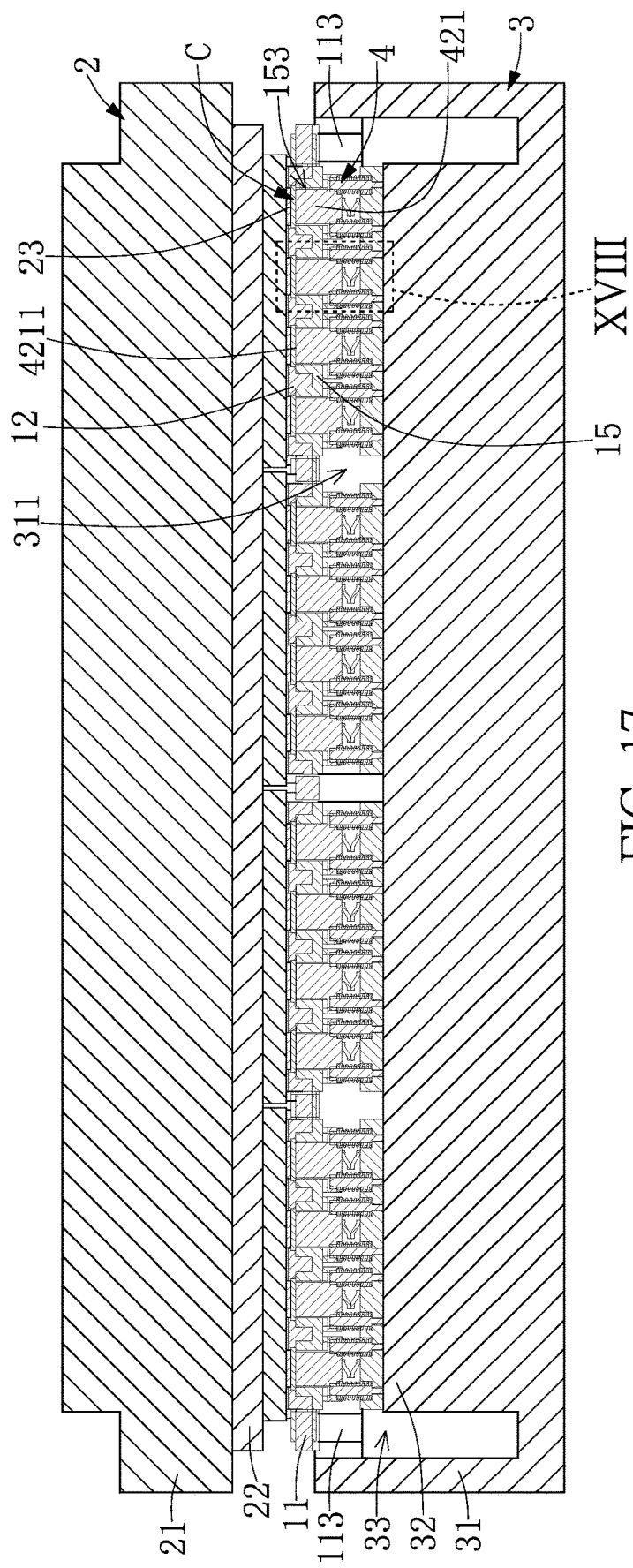
FIG. 17 is a sectional view showing the lid assembled with the chip tray kit according to the present disclosure.

In a practical application, the lid 3 and the tray 11 can respectively include a plurality of guide structures 33 and a plurality of guide structures 113 that are configured to be engaged with each other. For example, each of the guide structures 33 of the lid 3 can include a blind hole, each of the guide structures 113 of the tray 11 can be a column structure, and when the lid 3 covers the side of the tray 11, the column structures of the tray 11 would be engaged with the blind holes of the lid 3. Through the design of the guide structures 33 of the lid 3 and the guide structures 113 of the tray 11, the lid 3 can swiftly and correctly cover the side of the tray 11 so that each of the pressing assemblies 4 can be swiftly and correctly arranged on one side of the corresponding one of the chips C in the chip accommodating slot 122. The quantity and structure of the guide structures 33 of the lid 3 and the guide structures 113 of the tray 11 are not limited to those shown in FIG. 1, FIG. 16, and FIG. 17.

Referring to FIG. 13 to FIG. 18, each of the pressing assemblies 4 includes a base seat 4, a pressing member 42, and two elastic members 43. In the present embodiment, sixteen pressing assemblies 4 share one of the base seats 41, but the present disclosure is not limited thereto. In other embodiments, the pressing assemblies 4 can be provided to not share the same base seat 41. The base seats 41 can be detachably fixed to the conduction structure 32 of the lid 3. In other embodiments, the base seats 41 and the conduction structure 32 can be a one-piece structure. In an embodiment of the present disclosure, the base seats 41 are detachably fixed to the lid 3, and the pressing assemblies 4 can be easily changed and maintained by technical personnel.

Each of the pressing members 42 includes the contacting portion 421 and an abutting portion 422. The contacting portion 421 includes a contacting surface 4211, the outer diameter W4 of the contacting portion 421 is less than the diameter W3 (as shown in FIG. 8) of the insertion thru-hole 153, a portion of the contacting portion 421 is configured to extend into the thru-hole 153 (as shown in FIG. 18), and the contacting surface 4211 is configured to press the surface C1 of the chip C. Primarily, the contacting portions 421 are configured to press the surfaces C1 of the chips C so that the chips C can be stably connected to the testing machine 2 (as shown in FIG. 1). Therefore, when the chips C are tested by the testing machine 2, an issue of the chips C separating from the probe sockets 23 (as shown in FIG. 2) can be avoided.

In each of the pressing members 42, the abutting portion 422 is connected to the contacting portion 421, and the abutting portion 422 is configured to limit a movement range of the pressing member 42 relative to the auxiliary insertion member 15 so as to prevent the contacting portion 421 from overly pressing on the chip C. As shown in FIG. 18, when the lid 3 covers the side of the tray 11, the abutting portion 422 of each of the pressing members 42 is arranged at one side of the auxiliary insertion member 15, the contacting portion 421 of the pressing member 42 is correspondingly arranged in the insertion thru-hole 153, and the contacting surface 4211 is correspondingly arranged at one side of the surface C1 of the chip C.

Two ends of each of the elastic members 43 are fixed to one of the base seats 41 and one of the pressing members 42. When the contacting surface 4211 of one of the pressing members 42 is in contact with the surface C1 of the chip C and the surface C1 is uneven, at least one of the elastic members 43 is in a pressed state, and the elastic returning force generated by the elastic member 43 being pressed allows the contacting surface 4211 to be tightly in contact with the surface C1 of the chip C. The quantity of the elastic members 43 included in each of the pressing assemblies 4 is not limited to two. In other embodiments, each of the pressing assemblies 4 can include one elastic member 43 or at least three elastic members 43.

Figure 14:
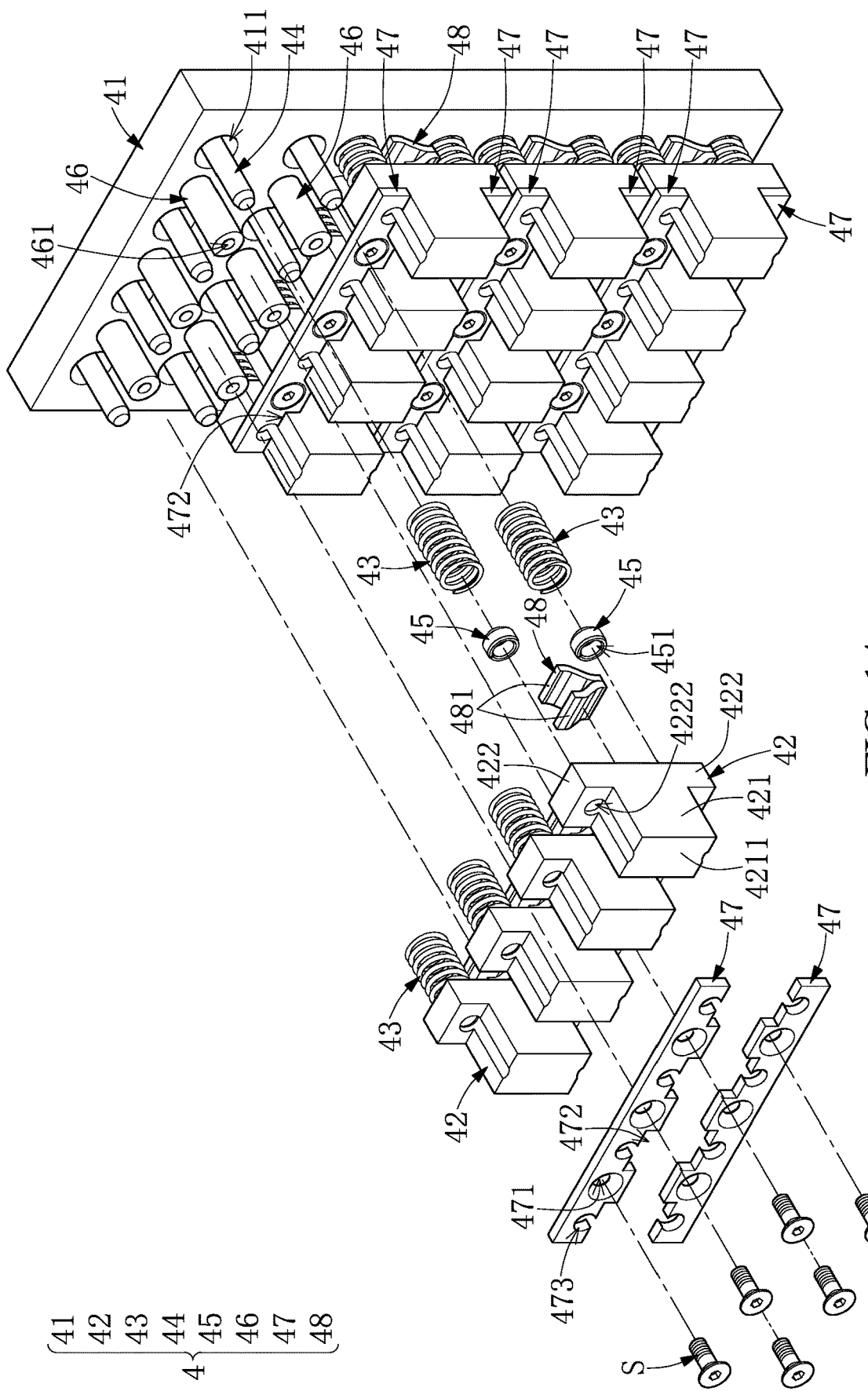
FIG. 14 is a partial exploded view of a pressing assembly of the present disclosure.
Figure 15:
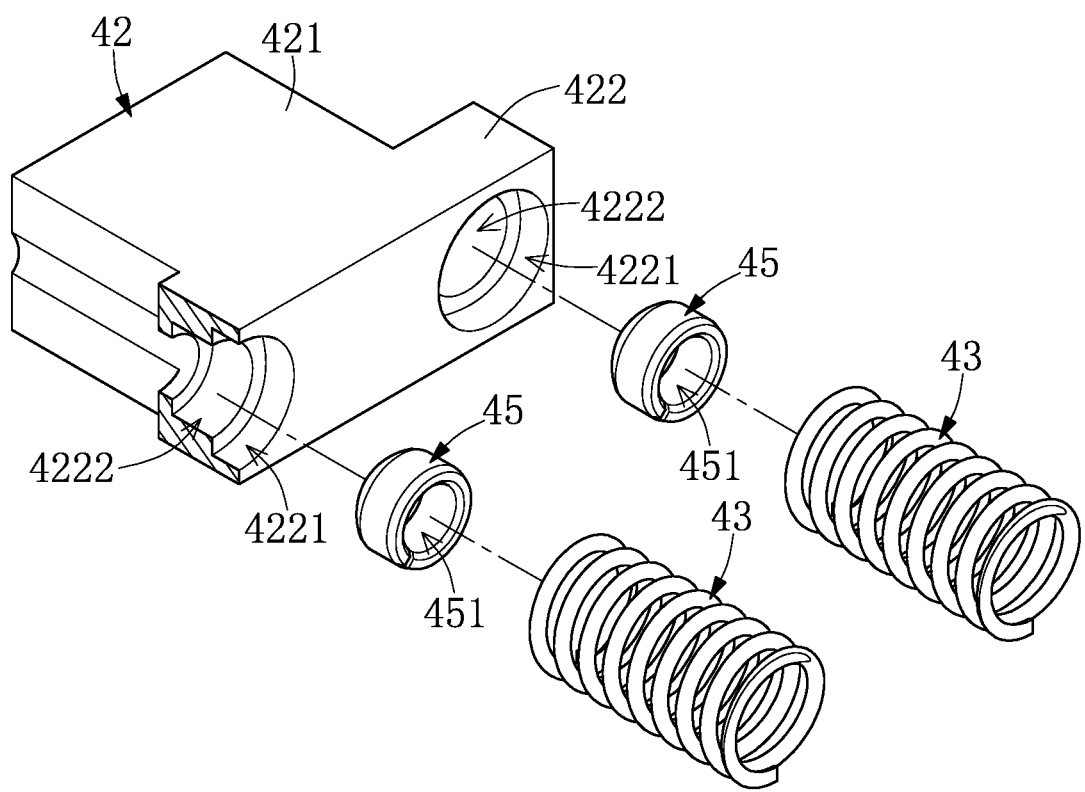
FIG. 15 is a partial enlarged view of the pressing assembly of the present disclosure.

As shown in FIG. 14 and FIG. 15, in a practical application, the elastic member 43 can be a compression spring. Each of the pressing assemblies 4 can include two compression springs (i.e., elastic members 43), and each of the pressing assemblies 4 can further include two guide members 44 and two fixing kits 45. The abutting portion 422 of the pressing member 42 can include two first recesses 4221, each of the base seats 41 can include two second recesses 411, each of the first recesses 4221 faces toward one of the second recesses 411, and two ends of each of the compression springs are respectively engaged with one of the first recesses 4221 and one of the second recesses 411.

The abutting portion 422 of each of the pressing members 42 can further include two penetrating holes 4222, each of the penetrating holes 4222 is in spatial communication with the corresponding one of the first recesses 4221, the two fixing kits 45 are fixed in the two penetrating holes 4222, each of the fixing kits 45 includes a penetrating hole 451, one end of each of the guide members 44 is fixed to one of the base seats 41, and another end of each of the guide members 44 penetrates through the penetrating hole 451 of the corresponding one of the fixing kits 45. When each of the pressing members 42 moves relatively to the base seat 41, each of the fixing kits 45 can move relative to the corresponding one of the guide members 44, and the two guide members 44 and the two fixing kits 45 can jointly limit a movement direction of each of the pressing members 42 relatively to the base seat 41. Through the two guide members 44 and the two fixing kits 45, each of the pressing members 42 can be effectively limited to substantially move in a direction perpendicular to an axis L (as shown in FIG. 18) of a surface of the base seat 41. Therefore, when each of the pressing members 42 presses the surface C1 of the chip C, the contacting portion 421 of the pressing member 42 would be in contact with the surface C1 of the chip C through the overall contacting surface 4211.

As shown in FIG. 14, each of the pressing assemblies 4 can further include at least one fixing structure 46 and at least one limiting member 47. The limiting member 47 is detachably fixed to the fixing structure 46, a portion of the limiting member 47 abuts against the abutting portions 422 of the pressing members 42, and the limiting member 47 and the fixing structure 46 are configured to jointly limit the movement range of the pressing members 42 relative to the base seat 41. For example, each of the base seats 41 can include twenty four fixing structures 46, every four of the twenty four fixing members 46 are arranged in a row and disposed on the base seat 41, every six of the fixing structures 46 and two of the limiting members 47 jointly limit four of the pressing members 42, and twenty-four of the fixing structures 46 are in cooperation with eight of the limiting members 47 so that sixteen of the pressing members 42 are disposed on the base seat 41. Each of the fixing structures 46 can include a screwing hole 461, each of the limiting members 47 includes three thru-holes 471, and three screws S can be in cooperation with three of the fixing structures 46 and three thru-holes 471 of one of the limiting members 47 so that one of the limiting members 47 is fixed to three of the fixing structures 46, and one of the limiting members 47 correspondingly presses the abutting portions 422 of four of the pressing members 42.

In a practical application, each of the limiting members 47 can further include an accommodating notch 472 configured to accommodate a portion of the contacting portion 421. In FIG. 14 of the present embodiment, one of the limiting members 47 abuts against the abutting portions 422 of four of the limiting members 47 at the same time. Therefore, the limiting members 47 can correspondingly include four accommodating notches 472, and each of the four accommodating notches 472 correspondingly accommodate a portion of the contacting portion 421 of the four limiting members 47. Through the design of the accommodating notches 472, the movement direction of each of the pressing members 42 relative to the base seat 41 can be auxiliarily limited, and each of the pressing members 42 substantially moves in the direction perpendicular to the axis L (as shown in FIG. 18) of the base seat 41.

In an embodiment of the present disclosure, each of the pressing assemblies 4 has the guide members 44, each of the limiting members 47 can correspondingly include at least one avoidance thru-hole 473, and each of the avoidance thru-holes 473 are configured to be penetrated by one of the guide members 44. In other words, when each of the pressing members 42 moves toward one of the base seats 41, a portion of each of the guide members 44 penetrates through one of the avoidance thru-holes 473. The structure of the avoidance thru-holes 473 is not limited to that shown in FIG. 14.

Referring to FIG. 1, FIG. 13, and FIG. 16 to FIG. 18, the temperature adjusting device 5 can be connected to the pressing assemblies 4 through the lid 3. The temperature adjusting device 5 is configured to allow a temperature of each of the pressing members 42 to reach a predetermined temperature. Through the temperature adjusting device 5, when the chips C disposed on the chip fixing members 12 are connected to the testing machine 2 and tested by the testing machine 2, the pressing members 42 reaching the predetermined temperature press the surfaces C1 (as shown in FIG. 8) of the chips C (as shown in FIG. 8). In this way, the chips C can be tested in an environment having the predetermined temperature. In a preferable embodiment, each of the pressing members 42 can be made of a metal material having a high thermal conductivity.

In a conventional chip testing operation, a plurality of chips are disposed and tested in a huge freezer or an oven. Since the temperatures of different areas in the freezer or the oven are not exactly the same, the chips cannot be performed with the chip testing operation in the same temperature. Therefore, a testing result is not reliable. In contrast, when the chips C are tested by the testing machine 2 of the chip testing apparatus A of the present disclosure, the contacting surface 4211 of each of the pressing members 42 having the predetermined temperature can allow the testing machine 2 to press the surface C1 of the chip C. Therefore, the chips C can be tested substantially at the same temperature.

In a practical application, the temperature adjusting device 5 can allow the temperature of each of the pressing members 42 to reach the predetermined temperature in any manner according to practical requirements, and the present disclosure is not limited thereto. For example, the temperature adjusting device 5 can be connected to the conduction structure 32 of the lid 3, each of the base seats is fixed to the conduction structure 32, the temperature adjusting device 5 can allow a temperature of the conduction structure 32 to increase or decrease, and the conduction structure 32 can mutually transfer heat with the pressing members 42 through the base seats 41 and the elastic members 43 so that the temperature of each of the pressing members 42 reaches the predetermined temperature. The conduction structure 32 mentioned herein is a structure made of a material having a high thermal conductivity. In an embodiment of the present disclosure, the main body 31 of the lid 3 and the conduction structure 32 are formed as a one-piece structure, and the temperature adjusting device 5 and the pressing assemblies 4 mutually transfer heat through the lid 3. In an embodiment of the present disclosure, the main body 31 of the lid 3 and the conduction structure 32 are not formed as a one-piece structure, and the temperature adjusting device 5 can be directly connected to the conduction structure 32.

In one embodiment of the present disclosure, the conduction structure 32 can internally include at least one fluid channel (not shown), and the temperature adjusting device 5 is configured to provide a fluid into the fluid channel so that the temperature of the conduction structure 32 increases or decreases. The fluid can be various types of high-temperature fluids or low-temperature fluids. In one embodiment of the present disclosure, the temperature adjusting device 5 can include a temperature controller (not shown) and a heating coil (not shown), the temperature controller is electrically connected to the heating coil, the heating coil is disposed in the conduction structure 32, and the temperature controller is configured to drive the heating coil to be operated so that the temperature of the conduction structure 32 increases. In an embodiment of the present disclosure, the temperature adjusting device 5 includes the temperature controller, the temperature adjusting device 5 can further include a cooling chip (not shown), the temperature controller is electrically connected to the cooling chip, the cooling chip is disposed in the conduction structure 32, the temperature controller is configured to drive the cooling chip to be operated so that the temperature of the conduction structure 32 decreases. In a practical application, both the cooling chip and the heating coil can be disposed in the conduction structure 32 at the same time, and the present disclosure is not limited thereto.

Referring to FIG. 14, each of the pressing assemblies 4 can further include a heat conduction member 48 so that the temperature of the pressing member 42 can easily reach the predetermined temperature. The heat conduction members 48 are arranged between the pressing members 42 and the base seats 41, the heat conduction members 48 are connected to the pressing members 42 and the base seat 41, and the heat conduction members 48 are configured to facilitate the heat to be transferred between the pressing members 42 and the base seat 41. Each of the heat conduction members 48 can include two elastic arms 481, and an end of one of the elastic arms 481 is connected to an end of the other one of the elastic arms 481. When the pressing members 42 move toward the base seat 41, the two elastic arms 481 are pressed by the pressing members 42 and are elastically deformed. When the pressing members 42 move away from the base seat 41, an elastic returning force generated by each of the elastic arms 481 being pressed allows the elastic arms 481 to return to an unpressed state. In this way, whether the pressing members 42 are static or moving relative to the base seat 41, the heat between the pressing members 42 and the conduction structure 32 can be preferably transferred by the heat conduction member 48. It is worth mentioning that the guide members 44 and the fixing kits 45 mentioned above can be also made of a material having a high thermal conductivity, and the guide members 44 and the fixing kits 45 can be also used to facilitate the heat to be transferred between the pressing members 42, the base seat 41, and the conduction structure 32.

Referring to FIG. 1 and FIG. 16 to FIG. 19, in a practical application, the chip testing apparatus A can further include an air suction device 6, a transferring device 7, and a processing device 8. The processing device 8 is electrically connected to the testing machine 2, the air suction device 6, and the transferring device 7, and the processing device 8 can control the testing machine 2, the air suction device 6, and the transferring device 7 to be operated. The processing device 8 can be various types of computers or servers.

The transferring device 7 is connected to the lid 3, and the transferring device 7 can move the lid 3 toward or away from the tray 11. The transferring device 7 mentioned herein is primarily configured to move the lid 3 and the tray 11 toward or away from each other. Therefore, in other embodiments, the transferring device 7 can be connected to the tray 11, and the transferring device 7 can move the tray 11 toward or away from the lid 3.

When the transferring device 7 moves the lid 3 toward the tray 11, the lid 3 covers one side of the tray 11, and one side of the tray 11 opposite to the lid 3 is fixed to the testing machine 2. The contacting surface 4211 of each of the pressing members 42 abuts against the surface C1 of the chip C, one side of the chip C is connected to the probe socket 23 of the testing machine 2, and the lid 3, the chip fixing member 12, the tray 11, and the chips C jointly define an enclosed space SP. At this time, the processing device 8 controls the air suction device 6 to suction air in the enclosed SP so that the enclosed space SP is in a negative pressure state.

It is worth mentioning that the chip testing apparatus A can further include a detector (not shown), the detector is electrically connected to the processing device 8, the detector is configured to detect whether the lid 3 covers the side of the tray 11, and the processing device 8 controls the air suction device 6 to be operated when the processing device 8 determines that the lid 3 already covers the side of the tray 11 according to a detecting result of the detector.

Since the air suction device 6 suctions away air in the enclosed space SP, and the enclosed space SP is in the negative pressure state, the air suction device 6 can effectively prevent a temperature inside of the enclosed space SP from being affected by the environment outside of the enclosed space SP. Moreover, a humidity of the enclosed space SP can also be effectively controlled, thereby effectively preventing condensation from occurring on the surface C1 of the chip C.

Referring to FIG. 8 and FIG. 18, the diameter W3 of the insertion hole 153 of each of the auxiliary insertion member 15 is less than the diameter W2 of the chip accommodating slot 122. Therefore, when the enclosed space SP is converted from the negative pressure state to a normal pressure state, and the transferring device 7 moves away from the tray 11, if the chip C adheres to the pressing member 42, the chip is pushed by an end of the protrusion 152 of the auxiliary insertion member 15 near the chip accommodating slot 122 to be separated from the contacting portion 421 when the contacting portion 421 leaves the auxiliary insertion member 15 along the thru-hole 153. In other words, since the auxiliary insertion members 15 are disposed on the tray 11, and the diameter W3 of the insertion hole 153 is less than the diameter W2 of the chip accommodating slot 122, it can be ensured that the chips C adhere to the contacting portions 421 when the lid 3 and the pressing members 4 move away from the tray 11.

When the chip testing apparatus A mentioned above of the present disclosure is manufactured and sold, the chip testing apparatus A can include the testing machine 2, the lid 3, the pressing assemblies 4, the temperature adjusting device 5, and the processing device 8, but the present disclosure is not limited thereto. In other embodiments, when the chip testing apparatus A of the present disclosure is manufactured and sold, it can further include at least one of the chip tray kit 1, the air suction device 6, and the transferring device 7. In addition, the chip tray kit 1 of the present disclosure can also be independently manufactured and sold.

Figure 19:
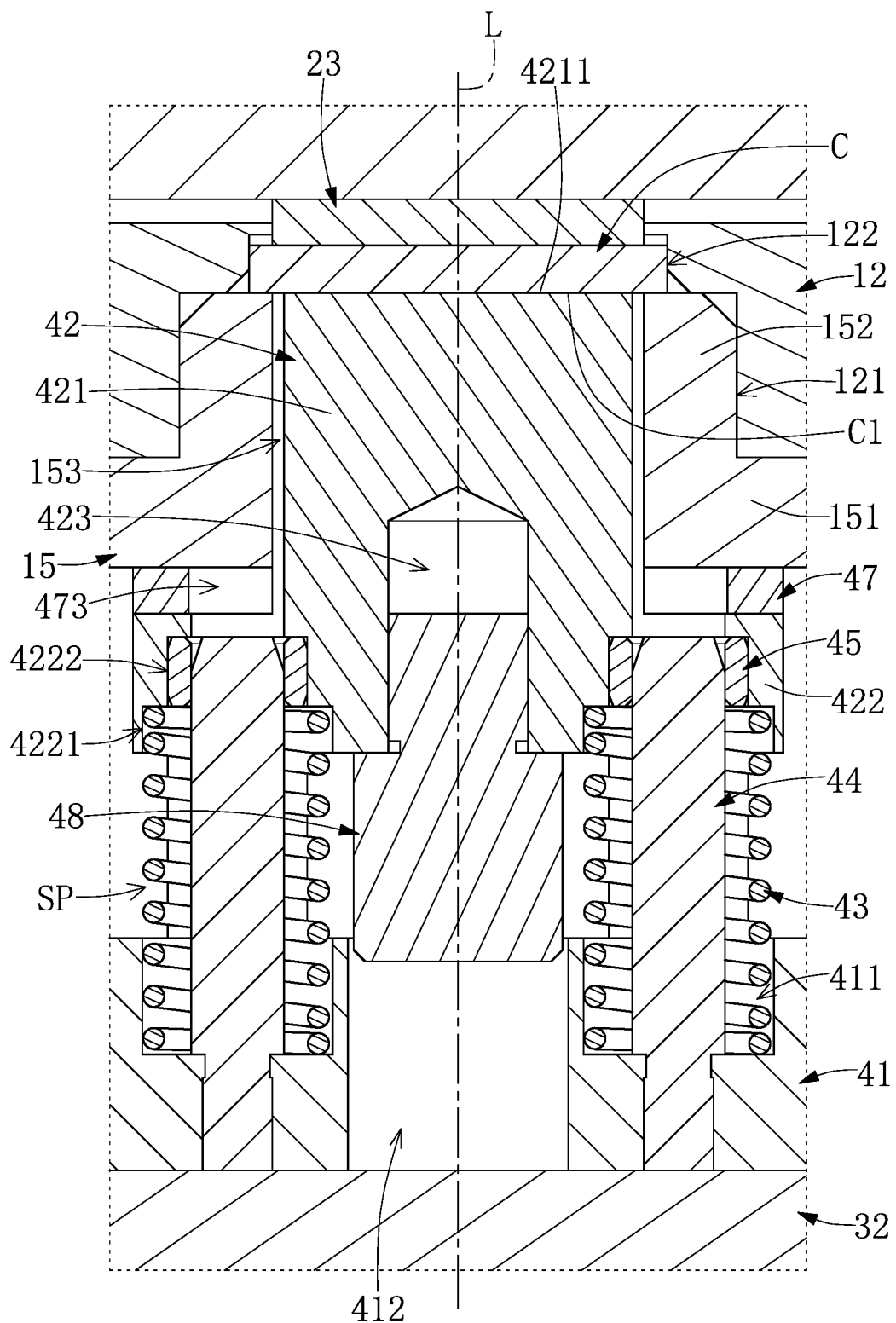
FIG. 19 is a sectional view of the pressing assembly according to another embodiment of the present disclosure.

Referring to FIG. 19, FIG. 19 is a sectional view of the pressing assembly of another embodiment of the present disclosure. The difference between the pressing assembly of the present embodiment and the pressing assembly of the previous embodiments is that the heat conduction member 48 can be in a column structure, an end of the heat conduction member 48 is fixed to a recess 423 of the pressing member 42, an end of the heat conduction member 48 is movably disposed in an accommodating slot 412 of the base seat 41, and another end of the heat conduction member 48 is fixed to the pressing member 42. When the pressing member 42 moves relatively to the base seat 41, the heat conduction member 48 correspondingly moves in the accommodating slot 412 of the base seat 41, the heat conduction member 48 is in contact with the side walls forming the accommodating slot 412 at any time, and the temperature adjusting device 5 and the pressing members 42 mutually transfer heat through the base seat 41 and the heat conduction member 48 in the column structure.

Beneficial Effects of the Embodiments

In conclusion, the pressing assembly of the present disclosure is applicable in the chip testing apparatus, the pressing assembly can press the surface of the chip that is being tested so that the chip can be stably connected to a related electrical connection socket when the chip is being tested. Further, the pressing assembly of the present disclosure can be connected to the temperature adjusting device, and the temperature of the pressing member can reach the predetermined temperature. Therefore, the pressing member pressing the surface of the chip that is being tested can allow the chip to be tested under the predetermined temperature. Through the pressing assembly and the temperature adjusting device, the chip testing apparatus of the present disclosure can allow the chip to be pressed by the pressing member to be stably connected to the testing machine when the chip is tested by the testing machine, and the pressing member having the predetermined temperature can allow the chip to be tested by the testing machine under the predetermined temperature. The chip testing apparatus of the present disclosure can further include the air suction device, and through the air suction device, the chip and the pressing member having the predetermined temperature are not easily affected by the external environment.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip tray kit, comprising:
a tray including a plurality of tray thru-holes each penetrating through the tray;
a plurality of chip fixing members detachably fixed to the tray, wherein each of the chip fixing members is arranged in the corresponding one of the tray thru-holes, each of the chip fixing members includes a plurality of fixing thru-holes, a plurality of accommodating recesses, and a plurality of chip accommodating slots, each of the fixing thru-holes penetrates through the chip fixing member, each of the accommodating recesses is in spatial communication with the corresponding one of the chip accommodating slots and the corresponding one of the fixing thru-holes, each of the chip accommodating slots is configured to accommodate a chip, each of the chip fixing members has at least one limiting structure formed in each of the chip accommodating slots, and the at least one limiting structure is configured to limit a movement range of the chip in the chip accommodating slot relative to the chip fixing member; and
a plurality of auxiliary insertion members detachably fixed to one side of the chip fixing members, wherein each of the auxiliary insertion members includes a main body, a plurality of protrusions, and a plurality of insertion thru-holes, the protrusions protrude from a side of the main body, and each of the insertion thru-holes penetrates through the main body and the corresponding one of the protrusions, and wherein an outer diameter of each of the protrusions is less than a diameter of each of the accommodating recesses, the outer diameter of each of the protrusions is greater than a diameter of each of the chip accommodating slots, and a diameter of each of the insertion thru-holes is less than the diameter of each of the chip accommodating slots;

wherein, when each of the auxiliary insertion members is fixed to a side of the corresponding one of the chip fixing members, each of the protrusions is correspondingly arranged in the accommodating recess, and a gap is formed between each of the protrusions and the chip disposed in the chip accommodating slot, and wherein the chip tray kit is configured to be fixed to a testing machine, the chips carried by the chip tray kit are configured to be electrically connected to the testing machine, and the testing machine is configured to test the chips, and wherein each of the insertion thru-holes is configured to be inserted into by a pressing member, and a portion of the pressing member penetrating through the insertion thru-hole is configured to press a surface of the corresponding one of the chips disposed in the chip accommodating slot, so that each of the chips is configured to be stably connected to the testing machine.

2. The chip tray kit according to claim 1, further comprising a plurality of auxiliary fixing members, wherein each of the auxiliary fixing members is detachably fixed to the tray, the auxiliary fixing members are disposed at an outer periphery of each of the tray thru-holes, and the auxiliary fixing members are configured to limit a movement range of the chip fixing members in the tray thru-holes relative to the tray.

3. The chip tray kit according to claim 2, further comprising a plurality of elastic members, wherein the elastic members are disposed between each of the chip fixing members and a plurality of side walls forming the corresponding one of the tray thru-holes.

4. The chip tray kit according to claim 1, further comprising a plurality of quick release members, wherein each of the auxiliary insertion members is configured to be detachably connected to the corresponding one of the chip fixing members through at least one of the quick release members.

5. The chip tray kit according to claim 4, wherein each of the chip fixing members includes at least one recess, the at least one recess is configured to allow one of the quick release members to be disposed therein, the quick release member disposed in the at least one recess includes two limiting members and two elastic members, an end of each of the elastic members is fixed to a side wall forming the at least one recess, another end of each of the elastic members is fixed to one of the limiting members, and a gap is formed between the two limiting members, wherein at least two engaging members are disposed at a side of each of the auxiliary insertion members, and wherein the at least two engaging members of each of the auxiliary insertion members are configured to be engaged with the two limiting members of the corresponding one of the chip fixing members.

6. The chip tray kit according to claim 5, wherein each of the auxiliary insertion members includes at least one thru-hole, and when each of the auxiliary insertion members is fixedly disposed on the side of the corresponding one of the chip fixing members, the at least one thru-hole is in spatial communication with the corresponding one of the gaps, and wherein each of the gaps is configured to be passed through by an insertion member, and the insertion member passing through the corresponding one of the thru-holes is configured to push the two limiting members so that the two limiting members are not engaged with the two engaging members.

7. The chip tray kit according to claim 6, wherein each of the limiting members includes an engaging slot, each of the limiting members is separated into a pushing portion and an engaging portion by the engaging slot, the engaging portion includes an engaging inclined surface, and each of the engaging members includes an engaging inclined surface, and wherein, when the engaging inclined surface of each of the engaging members is in contact with the engaging inclined surface of the corresponding one of the limiting members, a movement range of each of the engaging members relative to the limiting member is limited.

8. A chip testing apparatus, comprising:
a chip tray kit including:
a tray including a plurality of tray thru-holes each penetrating through the tray;
a plurality of chip fixing members detachably fixed to the tray, wherein each of the chip fixing members is arranged in the corresponding one of the tray thru-holes, each of the chip fixing members includes a plurality of fixing thru-holes, a plurality of accommodating recesses, and a plurality of chip accommodating slots, each of the fixing thru-holes penetrates through the chip fixing member, each of the accommodating recesses is in spatial communication with the corresponding one of the chip accommodating slots and the corresponding one of the fixing thru-holes, each of the chip accommodating slots is configured to accommodate a chip, each of the chip fixing members has at least one limiting structure formed in each of the chip accommodating slots, and the at least one limiting structure is configured to limit a movement range of the chip in the chip accommodating slot relative to the chip fixing member; and
a plurality of auxiliary insertion members detachably fixed to one side of the chip fixing members, wherein each of the auxiliary insertion members includes a main body, a plurality of protrusions, and a plurality of insertion thru-holes, the protrusions protrude from a side of the main body, and each of the insertion thru-holes penetrates through the main body and the corresponding one of the protrusions, and wherein an outer diameter of each of the protrusions is less than a diameter of each of the accommodating recesses, the outer diameter of each of the protrusions is greater than a diameter of each of the chip accommodating slots, and a diameter of each of the insertion thru-holes is less than the diameter of each of the chip accommodating slots, wherein, when each of the auxiliary insertion members is fixed to a side of the corresponding one of the chip fixing members, each of the protrusions is correspondingly arranged in the accommodating recess, and a gap is formed between each of the protrusions and the chip disposed in the chip accommodating slot, and wherein the chip tray kit is configured to be fixed to a testing machine, the chips carried by the chip tray kit are configured to be electrically connected to the testing machine, and the testing machine is configured to test the chips, and wherein each of the insertion thru-holes is configured to be inserted into by a pressing member, and a portion of the pressing member penetrating through the insertion thru-hole is configured to press a surface of the corresponding one of the chips disposed in the chip accommodating slot so that each of the chips is configured to be stably connected to the testing machine;

a lid having an accommodating slot formed on one side thereof, wherein the lid is configured to cover a side of the tray;

a plurality of pressing assemblies disposed on the lid, wherein each of the pressing assemblies is arranged in the accommodating slot of the lid, and the pressing assemblies are configured to press the chips carried by the chip fixing members of the chip tray kit;

the testing machine configured to be connected to the chip tray kit, wherein the testing machine is configured to be electrically connected to the chips carried by the chip tray kit, and the testing machine is configured to test the chips disposed in the chip accommodating slots; and a temperature adjusting device connected to the pressing assemblies, wherein the temperature adjusting device is configured to allow a temperature of each of the pressing assemblies to reach a predetermined temperature.

9. The chip testing apparatus according to claim 8, wherein each of the pressing assemblies includes:

a base seat configured to be fixed to the lid;

a pressing member including a contacting portion, wherein the contacting portion has a contacting surface, a portion of the contacting portion is configured to extend into the at least one of the fixing thru-holes, and the contacting surface is configured to press the surface of the chip disposed in the corresponding one of the chip accommodating slots; and at least one elastic member having two ends respectively fixed to the base seat and the pressing member, wherein, when the pressing member presses the surface of the chip, the at least one elastic member is elastically deformed, and when the pressing member no longer presses the surface of the chip, an elastic returning force generated by the at least one elastic member being pressed allows the pressing member to return to a state where the pressing member does not press the chip.

10. The chip testing apparatus according to claim 9, wherein, when the lid covers the side of the tray, the lid, the tray, the chip fixing members, and the chips jointly define an enclosed space, and wherein the chip testing apparatus further includes an air suction device configured to suction away air in the enclosed space, so that the enclosed space is in a negative pressure state.

11. The chip testing apparatus according to claim 9, wherein the lid includes a main body and a conduction structure, the temperature adjusting device is connected to the conduction structure, the temperature adjusting device is configured to allow a temperature of the conduction structure to increase or decrease, each of the base seats is detachably fixed to the conduction structure, and the conduction structure and the pressing members transfer heat with each other through the base seats and the elastic members, so that the temperature of each of the pressing members reaches the predetermined temperature.

12. The chip testing apparatus according to claim 9, wherein each of the pressing assemblies further includes a heat conduction member and at least one limiting member that is disposed on the base seat, the heat conduction member is connected to the pressing member, the heat conduction member is connected to the base seat, the heat conduction member is arranged between the pressing member and the base seat, and the heat conduction member is configured to facilitate transfer of heat between the pressing member and the base seat.

13. The chip testing apparatus according to claim 9, wherein each of the pressing members further includes an abutting portion, each of the pressing assemblies further includes at least one fixing structure and at least one limiting member, the at least one fixing structure is fixed to the base seat, the at least one limiting member is detachably fixed with the at least one fixing structure, a portion of the at least one limiting member is configured to abut against the abutting portion of the pressing member, and the at least one limiting member and the at least one fixing member are configured to jointly limit a movement range of the pressing member relative to the base seat, and wherein the at least one limiting member includes an accommodating notch configured to accommodate a portion of the contacting portion.

14. The chip testing apparatus according to claim 8, wherein, when the lid covers the side of the tray, the lid, the tray, the chip fixing members, the auxiliary insertion members, and the chips jointly define an enclosed space, and wherein the chip testing apparatus further includes an air suction device configured to suction away air in the enclosed space, so that the enclosed space is in a negative pressure state.

15. The chip testing apparatus according to claim 8, wherein the chip tray kit further includes a plurality of auxiliary fixing members, each of the auxiliary fixing members is detachably fixed to the tray, the auxiliary fixing members are disposed at an outer periphery of each of the tray thru-holes, and the auxiliary fixing members are configured to limit a movement range of the chip fixing members in the tray thru-holes relative to the tray.

16. The chip testing apparatus according to claim 8, wherein the chip tray kit further includes a plurality of elastic members, wherein the elastic members are disposed between each of the chip fixing members and a plurality of side walls forming the corresponding one of the tray thru-holes.

17. The chip testing apparatus according to claim 8, wherein the chip tray kit further includes a plurality of quick release members, and wherein each of the auxiliary insertion members is detachably connected to the corresponding one of the chip fixing members through at least one of the quick release members.

18. The chip testing apparatus according to claim 17, wherein each of the chip fixing members includes at least one recess, the at least one recess is configured to allow one of the quick release members to be disposed therein, the quick release member disposed in the at least one recess includes two limiting members and two elastic members, an end of each of the elastic members is fixed to a side wall forming the at least one recess, another end of each of the elastic members is fixed to one of the limiting members, and a gap is formed between the two limiting members, wherein at least two engaging members are disposed at a side of each of the auxiliary insertion members, and wherein the at least two engaging members of each of the auxiliary insertion members are configured to be engaged with the two limiting members of the corresponding one of the chip fixing members.

19. The chip testing apparatus according to claim 18, wherein each of the auxiliary insertion members includes at least one thru-hole, and when each of the auxiliary insertion members is fixedly disposed on the side of the corresponding one of the chip fixing members, the at least one thru-hole is in spatial communication with the corresponding one of the gaps, and wherein each of the gaps is configured to be passed through by an insertion member, and the insertion member passing through the corresponding one of the thru-holes is configured to push the two limiting members so that the two limiting members are not engaged with the two engaging members.

20. The chip testing apparatus according to claim 19, wherein each of the limiting members includes an engaging slot, each of the limiting members is separated into a pushing portion and an engaging portion by the engaging slot, the engaging portion includes an engaging inclined surface, and each of the engaging members includes an engaging inclined surface, and wherein, when the engaging inclined surface of each of the engaging members is in contact with the engaging inclined surface of the corresponding one of the limiting members, a movement range of each of the engaging members relative to the limiting member is limited.

* * * * *